(12) United States Patent
Yano et al.

(10) Patent No.: US 6,615,386 B2
(45) Date of Patent: Sep. 2, 2003

(54) ERROR CORRECTING APPARATUS

(75) Inventors: Tetsuya Yano, Kawasaki (JP); Kazuhisa Obuchi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 450 days.

(21) Appl. No.: 09/753,884

(22) Filed: Jan. 3, 2001

(65) Prior Publication Data
US 2001/0020287 A1 Sep. 6, 2001

(30) Foreign Application Priority Data
Feb. 17, 2000 (JP) ........................................ 2000-039321

(51) Int. Cl.⁷ ............................................. H03M 13/00
(52) U.S. Cl. ..................................................... 714/780
(58) Field of Search ................................. 714/746, 752, 714/780, 822, 758, 779, 786, 799

(56) References Cited

U.S. PATENT DOCUMENTS 5,796,757 A * 8/1998 Czaja ........................... 714/780
6,065,149 A * 5/2000 Yamanaka .................. 714/780
6,304,617 B1 * 10/2001 Okamoto .................... 375/341

FOREIGN PATENT DOCUMENTS

JP          10135934        5/1998

* cited by examiner

Primary Examiner—Christine T. Tu
(74) Attorney, Agent, or Firm—Katten Muchin Zavis Rosenman

(57) ABSTRACT

Disclosed herein is an error correcting apparatus for receiving a signal subjected to a repetition processing in which a part of bits of an error-correction code train are repeatedly transmitted, and decoding the received signal so as to be restored to the original data. A repetition rate calculator calculates the repetition rate of the received signal subjected to the repetition processing, a soft decision data cut-off position decision unit decides the position at which a part of the soft decision data is cut off from the soft decision data which is generated by the repetition regenerator, on the basis of the repetition rate Rr, and a bit selector cuts off the part of the soft decision data at the decided cut-off position and inputs the cut part into a soft decision error-correction decoder.

8 Claims, 24 Drawing Sheets

FIG. 7
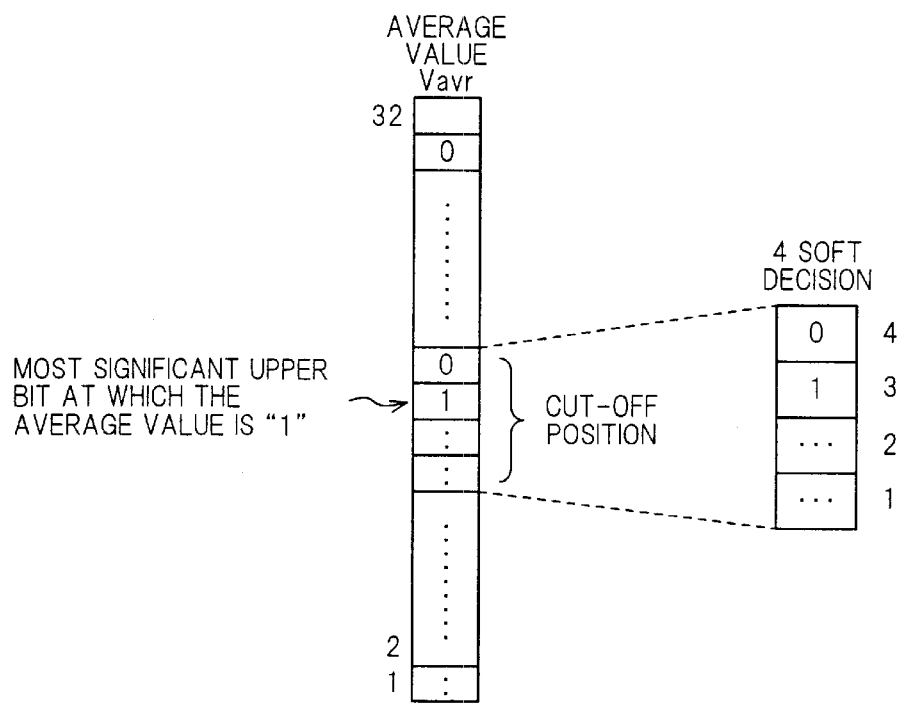
FIG. 8A
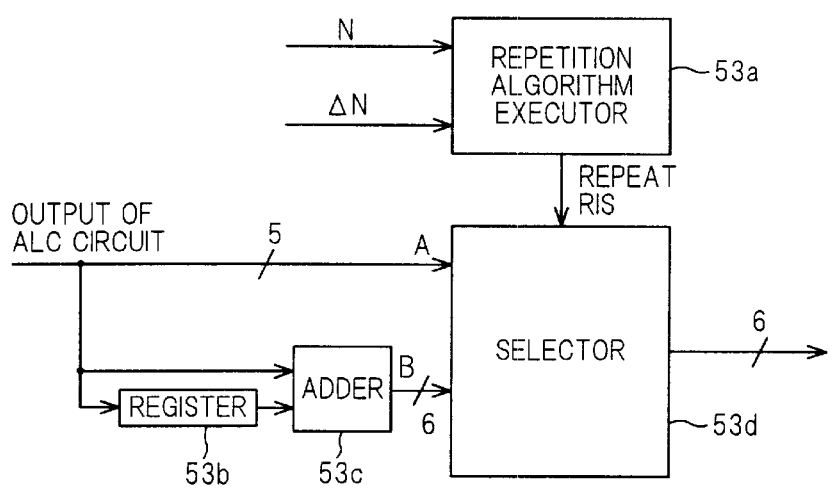
FIG. 8B
| SELECTED SIGNAL | CONDITION FOR SELECTION |
|---|---|
| A | RIS="0"→"0" |
| B | RIS="1"→"0" |
| NONE | RIS="1" |

FIG. 16A PRIOR ART

| SYMBOL RATE [ksps] | n[bits]/SLOT | DATA LENGTH PER FRAME Nm(=15×n) [bits]/FRAME |
|---|---|---|
| 15 | 10 | 150 |
| 30 | 20 | 300 |
| 60 | 40 | 600 |
| 120 | 80 | 1200 |
| 240 | 160 | 2400 |
| 480 | 320 | 4800 |
| 960 | 640 | 9600 |

FIG. 16B PRIOR ART

| SYMBOL RATE [ksps] | pilot [bits] | TPC [bits] | TFCI [bits] | FBI [bits] |
|---|---|---|---|---|
| 15 | 6 | 2 | 2 | 0 |
| 15 | 8 | 2 | 0 | 0 |
| 15 | 7 | 2 | 0 | 1 |
| 15 | 6 | 2 | 0 | 2 |
| 15 | 5 | 1 | 2 | 2 |

| SYMBOL RATE [ksps] | Data1 [bits] | Data2 [bits] | Data1+Data2 [bits] | TPC [bits] | TFCI [bits] | pilot [bits] | DATA LENGTH PER FRAME [bits] |
|---|---|---|---|---|---|---|---|
| 7.5 | 0 | 4 | 4 | 2 | 0 | 4 | 60 |
| 7.5 | 0 | 2 | 2 | 2 | 2 | 4 | 30 |
| 15 | 2 | 14 | 16 | 2 | 0 | 2 | 240 |
| 15 | 2 | 12 | 14 | 2 | 2 | 2 | 210 |
| 15 | 2 | 12 | 14 | 2 | 0 | 4 | 210 |
| 15 | 2 | 10 | 12 | 2 | 2 | 4 | 180 |
| 15 | 2 | 8 | 10 | 2 | 0 | 8 | 150 |
| 15 | 2 | 6 | 8 | 2 | 2 | 8 | 120 |
| 30 | 6 | 28 | 34 | 2 | 0 | 4 | 510 |
| 30 | 6 | 26 | 32 | 2 | 2 | 4 | 480 |
| 30 | 6 | 24 | 30 | 2 | 0 | 8 | 450 |
| 30 | 6 | 22 | 28 | 2 | 2 | 8 | 420 |
| 60 | 12 | 48 | 60 | 4 | 8 | 8 | 900 |
| 120 | 28 | 112 | 140 | 4 | 8 | 8 | 2100 |
| 240 | 56 | 232 | 288 | 8 | 8 | 16 | 4320 |
| 480 | 120 | 488 | 608 | 8 | 8 | 16 | 9120 |
| 960 | 248 | 1000 | 1248 | 8 | 8 | 16 | 18720 |

(a) BEFORE REPETITION (b) AFTER REPETITION

▨ IS A BIT INSERTED DUE TO REPETITION

FIG. 22 PRIOR ART

| BIT NUMBER BEFORE REPETITION | BIT NUMBER AFTER REPETITION | e | RIS: 1 MEANS BIT IS INSERTED DUE TO REPETITION |
|---|---|---|---|
| INITIAL VALUE | | 1 | |
| 1 | 1 | -47 | 1 |
| 1 | 2 | 385 | 0 |
| 2 | 3 | 337 | 0 |
| 3 | 4 | 289 | 0 |
| 4 | 5 | 241 | 0 |
| 5 | 6 | 193 | 0 |
| 6 | 7 | 145 | 0 |
| 7 | 8 | 97 | 0 |
| 8 | 9 | 49 | 0 |
| 9 | 10 | 1 | 0 |
| 10 | 11 | -47 | 1 |
| 10 | 12 | 385 | 0 |
| 11 | 13 | 337 | 0 |
| 12 | 14 | 289 | 0 |
| 13 | 15 | 241 | 0 |
| 14 | 16 | 193 | 0 |
| 15 | 17 | 145 | 0 |
| 16 | 18 | 97 | 0 |
| 17 | 19 | 49 | 0 |
| 18 | 20 | 1 | 0 |
| 19 | 21 | -47 | 1 |
| 19 | 22 | 385 | 0 |
| 20 | 23 | 337 | 0 |
| 21 | 24 | 289 | 0 |
| 22 | 25 | 241 | 0 |
| 23 | 26 | 193 | 0 |
| 24 | 27 | 145 | 0 |
| 25 | 28 | 97 | 0 |
| 26 | 29 | 49 | 0 |
| 27 | 30 | 1 | 0 |
| 28 | 31 | -47 | 1 |
| 28 | 32 | 385 | 0 |
| 29 | 33 | 337 | 0 |
| 30 | 34 | 289 | 0 |
| 31 | 35 | 241 | 0 |
| 32 | 36 | 193 | 0 |
| 33 | 37 | 145 | 0 |
| 34 | 38 | 97 | 0 |
| 35 | 39 | 49 | 0 |
| 36 | 40 | 1 | 0 |
| 37 | 41 | -47 | 1 |
| 37 | 42 | 385 | 0 |
| 38 | 43 | 337 | 0 |
| 39 | 44 | 289 | 0 |

FIG. 23 PRIOR ART

| BIT NUMBER BEFORE REPETITION | BIT NUMBER AFTER REPETITION | e | RIS: 1 MEANS BIT IS INSERTED DUE TO REPETITION |
|---|---|---|---|
| 40 | 45 | 241 | 0 |
| 41 | 46 | 193 | 0 |
| 42 | 47 | 145 | 0 |
| 43 | 48 | 97 | 0 |
| 44 | 49 | 49 | 0 |
| 45 | 50 | 1 | 0 |
| 46 | 51 | -47 | 1 |
| 46 | 52 | 385 | 0 |
| 47 | 53 | 337 | 0 |
| 48 | 54 | 289 | 0 |
| 49 | 55 | 241 | 0 |
| 50 | 56 | 193 | 0 |
| 51 | 57 | 145 | 0 |
| 52 | 58 | 97 | 0 |
| 53 | 59 | 49 | 0 |
| 54 | 60 | 1 | 0 |
| 55 | 61 | -47 | 1 |
| 55 | 62 | 385 | 0 |
| 56 | 63 | 337 | 0 |
| 57 | 64 | 289 | 0 |
| 58 | 65 | 241 | 0 |
| 59 | 66 | 193 | 0 |
| 60 | 67 | 145 | 0 |
| 61 | 68 | 97 | 0 |
| 62 | 69 | 49 | 0 |
| 63 | 70 | 1 | 0 |
| 64 | 71 | -47 | 1 |
| 64 | 72 | 385 | 0 |
| 65 | 73 | 337 | 0 |
| 66 | 74 | 289 | 0 |
| 67 | 75 | 241 | 0 |
| 68 | 76 | 193 | 0 |
| 69 | 77 | 145 | 0 |
| 70 | 78 | 97 | 0 |
| 71 | 79 | 49 | 0 |
| 72 | 80 | 1 | 0 |
| 73 | 81 | -47 | 1 |
| 73 | 82 | 385 | 0 |
| 74 | 83 | 337 | 0 |
| 75 | 84 | 289 | 0 |
| 76 | 85 | 241 | 0 |
| 77 | 86 | 193 | 0 |
| 78 | 87 | 145 | 0 |
| 79 | 88 | 97 | 0 |
| 80 | 89 | 49 | 0 |
| 81 | 90 | 1 | 0 |
| 82 | 91 | -47 | 1 |
| 82 | 92 | 385 | 0 |
| 83 | 93 | 337 | 0 |
| 84 | 94 | 289 | 0 |
| 85 | 95 | 241 | 0 |
| 86 | 96 | 193 | 0 |
| 87 | 97 | 145 | 0 |
| 88 | 98 | 97 | 0 |
| 89 | 99 | 49 | 0 |
| 90 | 100 | 1 | 0 |
| 91 | 101 | -47 | 1 |

FIG. 24 PRIOR ART

| BIT NUMBER BEFORE REPETITION | BIT NUMBER AFTER REPETITION | e | RIS: 1 MEANS BIT IS INSERTED DUE TO REPETITION |
|---:|---:|---:|---:|
| 91 | 102 | 385 | 0 |
| 92 | 103 | 337 | 0 |
| 93 | 104 | 289 | 0 |
| 94 | 105 | 241 | 0 |
| 95 | 106 | 193 | 0 |
| 96 | 107 | 145 | 0 |
| 97 | 108 | 97 | 0 |
| 98 | 109 | 49 | 0 |
| 99 | 110 | 1 | 0 |
| 100 | 111 | -47 | 1 |
| 100 | 112 | 385 | 0 |
| 101 | 113 | 337 | 0 |
| 102 | 114 | 289 | 0 |
| 103 | 115 | 241 | 0 |
| 104 | 116 | 193 | 0 |
| 105 | 117 | 145 | 0 |
| 106 | 118 | 97 | 0 |
| 107 | 119 | 49 | 0 |
| 108 | 120 | 1 | 0 |
| 109 | 121 | -47 | 1 |
| 109 | 122 | 385 | 0 |
| 110 | 123 | 337 | 0 |
| 111 | 124 | 289 | 0 |
| 112 | 125 | 241 | 0 |
| 113 | 126 | 193 | 0 |
| 114 | 127 | 145 | 0 |
| 115 | 128 | 97 | 0 |
| 116 | 129 | 49 | 0 |
| 117 | 130 | 1 | 0 |
| 118 | 131 | -47 | 1 |
| 118 | 132 | 385 | 0 |
| 119 | 133 | 337 | 0 |
| 120 | 134 | 289 | 0 |
| 121 | 135 | 241 | 0 |
| 122 | 136 | 193 | 0 |
| 123 | 137 | 145 | 0 |
| 124 | 138 | 97 | 0 |
| 125 | 139 | 49 | 0 |
| 126 | 140 | 1 | 0 |
| 127 | 141 | -47 | 1 |
| 127 | 142 | 385 | 0 |
| 128 | 143 | 337 | 0 |
| 129 | 144 | 289 | 0 |
| 130 | 145 | 241 | 0 |
| 131 | 146 | 193 | 0 |
| 132 | 147 | 145 | 0 |
| 133 | 148 | 97 | 0 |
| 134 | 149 | 49 | 0 |
| 135 | 150 | 1 | 0 |
| 136 | 151 | -47 | 1 |
| 136 | 152 | 385 | 0 |
| 137 | 153 | 337 | 0 |
| 138 | 154 | 289 | 0 |
| 139 | 155 | 241 | 0 |
| 140 | 156 | 193 | 0 |
| 141 | 157 | 145 | 0 |
| 142 | 158 | 97 | 0 |

FIG. 25 PRIOR ART

| BIT NUMBER BEFORE REPETITION | BIT NUMBER AFTER REPETITION | e | RIS: 1 MEANS BIT IS INSERTED DUE TO REPETITION |
|---|---|---|---|
| 143 | 159 | 49 | 0 |
| 144 | 160 | 1 | 0 |
| 145 | 161 | -47 | 1 |
| 145 | 162 | 385 | 0 |
| 146 | 163 | 337 | 0 |
| 147 | 164 | 289 | 0 |
| 148 | 165 | 241 | 0 |
| 149 | 166 | 193 | 0 |
| 150 | 167 | 145 | 0 |
| 151 | 168 | 97 | 0 |
| 152 | 169 | 49 | 0 |
| 153 | 170 | 1 | 0 |
| 154 | 171 | -47 | 1 |
| 154 | 172 | 385 | 0 |
| 155 | 173 | 337 | 0 |
| 156 | 174 | 289 | 0 |
| 157 | 175 | 241 | 0 |
| 158 | 176 | 193 | 0 |
| 159 | 177 | 145 | 0 |
| 160 | 178 | 97 | 0 |
| 161 | 179 | 49 | 0 |
| 162 | 180 | 1 | 0 |
| 163 | 181 | -47 | 1 |
| 163 | 182 | 385 | 0 |
| 164 | 183 | 337 | 0 |
| 165 | 184 | 289 | 0 |
| 166 | 185 | 241 | 0 |
| 167 | 186 | 193 | 0 |
| 168 | 187 | 145 | 0 |
| 169 | 188 | 97 | 0 |
| 170 | 189 | 49 | 0 |
| 171 | 190 | 1 | 0 |
| 172 | 191 | -47 | 1 |
| 172 | 192 | 385 | 0 |
| 173 | 193 | 337 | 0 |
| 174 | 194 | 289 | 0 |
| 175 | 195 | 241 | 0 |
| 176 | 196 | 193 | 0 |
| 177 | 197 | 145 | 0 |
| 178 | 198 | 97 | 0 |
| 179 | 199 | 49 | 0 |
| 180 | 200 | 1 | 0 |
| 181 | 201 | -47 | 1 |
| 181 | 202 | 385 | 0 |
| 182 | 203 | 337 | 0 |
| 183 | 204 | 289 | 0 |
| 184 | 205 | 241 | 0 |
| 185 | 206 | 193 | 0 |
| 186 | 207 | 145 | 0 |
| 187 | 208 | 97 | 0 |
| 188 | 209 | 49 | 0 |
| 189 | 210 | 1 | 0 |
| 190 | 211 | -47 | 1 |
| 190 | 212 | 385 | 0 |
| 191 | 213 | 337 | 0 |
| 192 | 214 | 289 | 0 |
| 193 | 215 | 241 | 0 |

| BIT NUMBER BEFORE REPETITION | BIT NUMBER AFTER REPETITION | e | RIS: 1 MEANS BIT IS INSERTED DUE TO REPETITION |
|---|---|---|---|
| 194 | 216 | 193 | 0 |
| 195 | 217 | 145 | 0 |
| 196 | 218 | 97 | 0 |
| 197 | 219 | 49 | 0 |
| 198 | 220 | 1 | 0 |
| 199 | 221 | -47 | 1 |
| 199 | 222 | 385 | 0 |
| 200 | 223 | 337 | 0 |
| 201 | 224 | 289 | 0 |
| 202 | 225 | 241 | 0 |
| 203 | 226 | 193 | 0 |
| 204 | 227 | 145 | 0 |
| 205 | 228 | 97 | 0 |
| 206 | 229 | 49 | 0 |
| 207 | 230 | 1 | 0 |
| 208 | 231 | -47 | 1 |
| 208 | 232 | 385 | 0 |
| 209 | 233 | 337 | 0 |
| 210 | 234 | 289 | 0 |
| 211 | 235 | 241 | 0 |
| 212 | 236 | 193 | 0 |
| 213 | 237 | 145 | 0 |
| 214 | 238 | 97 | 0 |
| 215 | 239 | 49 | 0 |
| 216 | 240 | 1 | 0 |

ERROR CORRECTING APPARATUS

BACKGROUND OF THE INVENTION

The present invention relates to an error correcting apparatus and, more particularly, to an error correcting apparatus which receives a signal subjected to a repetition processing for repeatedly transmitting a part of bits of an error-correction code train, and which restores the received signal to the original data train by subjecting the signal to a repetition regeneration processing and an error correcting decoding processing.

An error-correction coding technique is adopted so as to correct an error contained in received information or regenerated information and to restore it to the correct original information. Various codes such as a convolutional code and a turbo code are known as an error-correction code, and the error-correction coding technique is applied to various systems. In CDMA mobile communication, for example, an error-correction encoder 1 subjects information to be transmitted to an error-correction encoding processing, and a CDMA transmitter 2 subjects the code obtained with an error-correction code to a spread modulation processing and transmits it from an antenna, as shown in FIG. 12A. On the other hand, on the reception side, a soft decision error-correction decoder 4 subjects a soft decision data train obtained by the despreading operation and the RAKE combining operation of a CDMA receiver 3 to an error-correction processing, decodes the data and outputs the original transmitted information before the error-correction encoding processing, as shown in FIG. 12B. A soft decision data a 1-bit data represented by a plurality of bits depending upon the level.

FIG. 13 shows the structure of a CDMA transmitter in a mobile station. The error-correction encoder 1 subjects a data to be transmitted to an error-correction encoding processing and inputs it into a mapping portion 21. A control data generator 22 generates a control data such as a pilot PILOT and inputs it into the mapping portion 21. The mapping portion 21 outputs an error-correction code as an in-phase component data, and the control data as quadrature component respectively for quadrature modulation at a constant symbol rate. Spreaders 23a, 23b subject the in-phase (I) component and the quadrature (Q) component which are input from the mapping portion 21 to spreading modulation by using a predetermined spreading code, and input the spread data into DA converters 25a, 25b, respectively, via waveform shaping filters 24, 24b. A QPSK quadrature modulator 26 subjects an $I_{ch}$ signal, and a $Q_{ch}$ signal output from each DA converter to QPSK quadrature modulation, and a radio transmitter 27 converts the frequency of a baseband signal output from the quadrature modulator 26 into a radio frequency (IF→RF), amplifies the frequency, and transmits the signal from an antenna.

FIG. 14 shows the structure of a CDMA receiver 3 for 1 channel in a CDMA receiving apparatus at a base station. A radio receiver 31 converts the frequency of a high-frequency signal received from an antenna into a frequency of a baseband signal (RF→IF). A QPSK quadrature detector 32 subjects the baseband signal to quadrature detection and outputs an in-phase (I) component data and a quadrature (Q) component data. In the quadrature detector 32, the reference numeral 32a denotes a receiving carrier generator, 32b a phase shifter for shifting the phase of a receiving carrier by π/2, and 32c and 32d multipliers for multiplying a baseband signal by a receiving carrier and outputting an I component signal and a Q component signal. Low-pass filters (LPF) 33a, 33b limit the band of an output signal, and AD converters 35a, 35b convert an I component signal and a Q component signal, respectively, into digital signals, and input them into a searcher 36 and each of the finger portions $37_{a1}$ to $37_{a4}$.

When a direct sequence signal (DS signal) influenced by a multi-path is input into the searcher 36, the searcher 36 detects the multi-path by an autocorrelation operation using a matched filter (not shown), and inputs the data on the timing for starting the despreading operation and the data on the delay time adjustment in each path constituting the multi-path into the corresponding finger portions $37_{a1}$ to $37_{a4}$. A despreading/adjustment time adjuster 41 of each of the finger portions $37_{a1}$ to $37_{a4}$ subjects a direct wave or a delayed wave which reaches via a predetermined path to a dispreading processing by using the same code as the spreading code for the purpose of dump integration, thereafter subjects it to a delay processing in accordance with the path and outputs a pilot signal (reference signal) and an information signal. A phase compensator (channel estimation unit) 42 averages the voltages of the I components and the Q components of the pilot signals for a predetermined number of slots, and outputs channel estimation signals $I_t$, $Q_t$. A synchronous detector 43 restores the phases of the despread information signals I', Q' to the original phases on the basis of the phase difference θ between the pilot signal contained in the received signal and a known pilot signal. That is, since the channel estimation signals $I_t$, $Q_t$ are the cos component and the sin component of the phase difference θ, the synchronous detector 43 demodulates (executes synchronous detection of) the received information signals (I, Q) by applying a phase rotation processing to the received information signals (I', Q') by using the channel estimation signals $I_t$, $Q_t$ in accordance with the following formula:

$$\begin{pmatrix} I \\ Q \end{pmatrix} = \begin{pmatrix} I_t & Q_t \\ -Q_t & I_t \end{pmatrix} \begin{pmatrix} I' \\ Q' \end{pmatrix}$$

A Rake combiner 37b combines the signals output from the finger portions $37_{a1}$ to $37_{a4}$, and outputs the combined signals to the soft decision error-correction decoder 4 (FIG. 12) as a soft decision data train.

FIG. 15 is an explanatory view of the frame format of an up signal transmitted from a mobile station to a base station. 1 frame is 10 msec and it is composed of 15 slots $S_0$~$S_{14}$. The data portion is mapped in an orthogonal I channel for QPSK quadrature modulation, and the portions other than the data portion are mapped in an orthogonal Q channel for QPSK quadrature modulation. The channel transmitting the data portion is called a DPDCH (Dedicated Physical Data Channel), and the channel transmitting the portions other than data is called a DPCCH (Dedicated Physical Control Channel). Each slot of the DPDCH (I channel) transmitting the data portion is composed of n bits, and n changes in accordance with a symbol rate.

FIG. 16A shows the relationship among the symbol rate (ksps), the number n of bits per slot, and the data length Nm (=15×n) per frame in the data channel DPDCH. The data channel DPDCH multiplexes and transmits the data in more than 1 transport channels. For example, the data channel DPDCH divides sound data into a sound data portion with a high degree of importance and a sound data portion with a low degree of importance, allocates a predetermined number of bits per frame to the respective sound data, multiplexes and transmits the data in different transport channels.

Each slot of the DPCCH (Q channel) for transmitting a control data is composed of 10 bits (see FIG. 15), and transmits a pilot PILOT, a transmission power control data TPC, a transport format combination indicator TFCI, and feedback information FBI at a constant symbol rate of 15 ksps. It is possible to change the number of bits of PILOT, TPC, TFCI, and FBI as occasion demands, as shown in FIG. 16B. PILOT is utilized when the reception side performs synchronous detection or measures a signal interference ratio SIR, TPC is utilized for the control of a transmission power, TFCI indicates the symbol rate or the number of bits per frame of data, the number of bits of data which increases by repetition, etc., and FBI is used to control the diversity transmission in the base station.

FIGS. 17A and 17B are explanatory views of the frame format and the structure of the slots of a down signal transmitted from a base station to a mobile station. 1 frame is 10 msec, and it consists of 15 slots $S_0$~$S_{14}$. Each slot is constituted by k bits, wherein k varies in accordance with the symbol rate. Each slot transmits a first data portion DATA1, a second data portion DATA2, a pilot PILOT, a transmission power control data TPC, and a transport format combination indicator TFCI. The number of bits of PILOT, TPC, TFCI vary in accordance with the symbol rate, as shown in FIG. 17B, and even if the symbol rate is the same, the number of bits varies as occasion demands. The data in each slot is alternately distributed into the I channel and the Q channel for QPSK quadrature modulation, and after it is subjected to spread modulation and quadrature modulation, the data with the frequency converted is transmitted to the mobile station.

As shown in FIGS. 16A and 17B, the maximum number of bits (data length Nm) per frame of data which can be transmitted depends on the system of connection between stations such as a symbol rate. On the other hand, since the error-correction code length Nc which is obtained by applying an error-correction coding processing to information to be transmitted varies in accordance with the length $N_I$ of the information to be transmitted, the relationship Nc=Nm does not always hold. For this reason, if Nc<Nm, as shown in FIG. 18, the period S during which no data is transmitted generates. In addition, in the case of multiplexing information to be transmitted in a plurality of transport channels, the sum of the lengths of data in the plurality of transport channels does not usually coincide with the maximum data length Nm, and the period S during which no data are transmitted generates.

In order to effectively utilize the period S during which no data is transmitted, a repetition processing for repeatedly transmitting a part of bits of the error-correction code train is applied so as to make the total length of the information to be transmitted coincide with the maximum data length Nm. According to this repetition processing, the transmission energy per bit increases, which leads to an increase in the error-correction ability of the reception side.

FIGS. 19A and 19B show the structures of a transmission system and a reception system, respectively, provided with a repetition function. In the transmission system shown in FIG. 19A, a repetition processor 5 is provided between the error-correction encoder 1 and the CDMA transmitter 2. In the reception system shown in FIG. 19B, a repetition regenerator 6 is provided between the CDMA receiver 3 and the soft decision error-correction decoder 4.

In the transmission system, the error-correction encoder 1 subjects information to be transmitted to an error-correction coding processing and produces error-correction codes, and the repetition processor 5 subjects the error-correction codes to a repetition processing in accordance with a repetition algorithm. Due to the repetition processing, a part of the error-correction code train appears a plurality of times in the train subjected to the repetition processing, as shown in FIG. 20. In the example shown in FIG. 20, second, fifth, eighth, eleventh, fourteenth, . . . bits are repeated. The CDMA transmitter 2 applies the spread modulation to the data which has been subjected to the repetition processing, and transmits the data.

In the reception system, the CDMA receiver 3 demodulates a received signal, and inputs a soft decision data train A (see FIG. 21) having a predetermined bit width which is obtained by demodulation to the repetition regenerator 6. The repetition regenerator 6 executes a repetition algorithm so as to identify the bits (second, fifth, eighth, eleventh, fourteenth, . . . ) which are repeatedly transmitted due to the repetition processing, adds the soft decision data which corresponds to the bits, and converts the result into a soft decision data train B which corresponds to the original error-correction code train. The soft decision data is constituted by sign bits and soft decision bits. Thenceforth, the soft decision error-correction decoder 4 executes an error-correction decoding processing by using the soft decision data train B which is output from the repetition regenerator 6, and restores the data to the original data train before the error-correction coding processing.

Each of the repetition processor 5 and the repetition regenerator 6 executes the following repetition algorithm. The parameters in the algorithm are as follows:

(1) N: number of bits of the data before the repetition processing
(2) ΔN: number of bits repeated due to the repetition
(3) (N+ΔN): number of bits of the data after the repetition processing
(4) e: parameter of the error which is updated in the algorithm (whether bits should be repeated or not is determined by judging the error e)
(5) e-ini: parameter used for determining the initial value of the error e
(6) e-plus: constant to be added to the error e when the error e is not more than 0 and predetermined bits are repeated (e-plus=a·N)
(7) e-minus: constant used for updating the error e (e-minus=a·ΔN)
(8) a: parameter used for determining e-plus or e-minus (e.g., a=2) In other words, execution of the repetition algorithm is enabled by giving the above 5 parameters N, ΔN, e-ini, e-plus, and e-minus, thereby enabling the decision of the repetition bits.

Repetition Algorithm
e=e-ini
m=1 (m is an interested bit)
do while m≦N (execute the following as long as this relationship holds)
  e=e−e-minus (e-minus=a·|ΔN|)
  do while e≦0 (execute the following as long as this relationship holds)
    repeat bit $x_m$ (repeat m-th bit $X_m$)
    e=e+e-plus (update e:e-plus=a·N)
  end do
  m=m+1 (increment the interested bit)
end do As a concrete example of the repetition algorithm, an algorithm in which the number of multiplexed transport channels is 1, the data length N of the error-correction codes is 216 bits, and the data length (N+ΔN) after the repetition processing is 240 bits is shown in FIGS. 22 to 26. The parameters used in the repetition are N=216, ΔN=24, e-ini=1, e-plus=432 and-e minus=48. As is clear from FIGS. 22 to 26, when the sign of the error e is minus as a result of the subtraction of 48, the bit is repeated (RIS="1"). In FIGS. 22 to 26, 1st, 10-th, 19-th, 28-th . . . 208-th bits are repeated.

As described above, the repetition regenerator 6 (FIG. 19) adds the bits which are repeatedly transmitted due to the repetition and generates the soft decision data train which corresponds to the original error-correction code train. As is clear from FIG. 21, the bit width of the soft decision data train increases by 1 bit due to the addition. In the example shown in FIG. 21, the number of soft decision bits is 5 including the sign bit before the repetition regeneration. However, after the repetition regeneration, the number of soft decision bits is 6 including the sign bit. In this manner, when the bit width of the soft decision data which is input into the error-correction decoder 4 increases, the circuit scale of the error-correction decoder 4 which uses a convolutional code or a turbo code inconveniently enlarges.

As a method for preventing the circuit scale of the error-correction decoder 4 from being enlarged, there is known a method of inputting the soft decision data which is output from the repetition regenerator 6 into the error-correction decoder 4 after the bit width of the data is reduced. In this method, (the sign bit+upper m bits) or (the sign bit+lower m bits) are cut off from the soft decision data of (the sign bit+(m+1)) bits which is output from the repetition regenerator 6, and input into the error-correction decoder 4. In the example shown in FIG. 21, (1) (the sign bit+upper 4 bits) of the soft decision data train B are input into the error-correction decoder 4, or (2) (the sign bit+lower 4 bits) of the soft decision data train B are input into the error-correction decoder 4.

There is, however, a problem in reducing the bit width by cutting off a part of the data at the same bit position irrespective of the repetition rate Rr (=(N+ΔN)/N). That is, the amount of deterioration in the error-correction ratio in the error-correction decoder 4 increases. FIG. 27 shows the relationship between the repetition rate and the amount of characteristic deterioration. In the case (1) of selecting the upper m bits, the smaller the repetition rate Rr is, the larger is the deterioration of the error-correction characteristic. In contrast, in the case (2) of selecting the lower m bits, the larger the repetition rate Rr is, the larger is the deterioration of the error-correction characteristic.

The reason is as follows. FIG. 28 shows the distribution of the signal having a predetermined size in correspondence with the repetition rate Rr. The larger the repetition rate Rr is, the larger is the range in which the most significant upper bit is valid (see the hatched area). In other words, as the repetition rate Rr becomes larger, it becomes more difficult to exactly represent the soft decision data output from the repetition regenerator by the lower m bits, while it is possible to represent them with accuracy by the upper m bits. As a result, when the repetition rate Rr becomes larger, the range where the most significant upper bit is valid enlarges, while when the repetition rate Rr becomes smaller, the range where the most significant upper bit is invalid enlarges, as shown in the tendency in FIG. 27.

SUMMARY OF THE INVENTION

Accordingly, it is an object of the present invention to eliminate the above-described problems in the related art, and to reduce the bit width of a soft decision data after repetition regeneration without deteriorating the error-correction characteristic due to the reduction of the bit width.

To achieve this object, in a first aspect of the present invention, there is provided an error correcting apparatus comprising a repetition regenerator, a repetition rate calculator, a soft decision data cut-off position decision unit, and a soft decision data cutting means. The repetition regenerator obtains the positions of the bits which are repeatedly transmitted due to a repetition processing, adds the soft decision data corresponding to the positions of the bits and generates a soft decision data train which corresponds to the original error-correction code train. The repetition rate calculator calculates the repetition rate of a received signal which is subjected to the repetition processing. More specifically, the repetition rate calculator calculates the repetition rate Rr=(N+ΔN)/N on the basis of the number N of bits of the data which is notified of from the communication party before a repetition processing and the number ΔN of bits which are repeated due to the repetition. The soft decision data cut-off position decision unit decides the position at which a part of the soft decision data which is to be input into the soft decision error-correction decoder is cut off from the soft decision data which is produced by the repetition regenerator, on the basis of the repetition rate. The soft decision data cutting means cuts off the part of the soft decision data on the basis of the decided cut-off position and inputs it into the soft decision error-correction decoder.

The amount of characteristic deterioration increases or decreases depending upon the position at which the part of the soft decision data is cut off, but this tendency reverses at a predetermined repetition rate $R_{TH}$. More specifically, if the actual repetition rate Rr is not more than $R_{TH}$ ($Rr \leq R_{TH}$), the amount of characteristic deterioration is smaller when the part of soft decision data is cut off at a first cut-off position which is the lower bit portion, but if Rr exceeds $R_{TH}$ ($Rr > R_{TH}$), the amount of characteristic deterioration is smaller when the part of soft decision data is cut off at a second cut-off position which is the upper bit portion. According to an error correcting apparatus provided in a first aspect of the present invention, it is possible to suppress the deterioration of the characteristic by switching the position at which the part of the soft decision data is cut off on the basis of the repetition rate.

In a second aspect of the present invention, there is provided an error correcting apparatus comprising a repetition regenerator, an average value calculator, a soft decision data cut-off position decision unit, and a soft decision data cutting means. The repetition regenerator obtains the positions of the bits which are repeatedly transmitted due to a repetition processing, adds the soft decision data corresponding to the positions of the bits, and generates a soft decision data train which corresponds to the original error-correction code train. The average value calculator calculates the average value of the soft decision data which is output from the repetition regenerator. The soft decision data cut-off position decision unit decides the position at which the part of the soft decision data which is to be input into the soft decision error-correction decoder is cut off from the soft decision data which is output from the repetition regenerator, on the basis of the average value. The soft decision data cutting means cuts off the part of the soft decision data at the decided cut-off position and inputs it into the soft decision error-correction decoder.

The amount of characteristic deterioration increases or decreases depending upon the position at which the part of the soft decision data is cut off, but this tendency reverses at a predetermined average value $V_{TH}$ of the soft decision data. More specifically, if the actual average value Va of the soft decision data is not more than $V_{TH}$ ($Va \leq V_{TH}$), the amount of characteristic deterioration is smaller when the part of soft decision data is cut off at a first cut-off position which is the lower bit portion, but if Va exceeds $V_{TH}$ (Va>$V_{TH}$), the amount of characteristic deterioration is smaller when the part of soft decision data is cut off at a second cut-off position which is the upper bit portion. According to an error correcting apparatus provided in a second aspect of the present invention, it is possible to suppress the deterioration of the characteristic by switching the position at which the part of the soft decision data is cut off on the basis of the average value of the soft decision data which is output from the repetition regenerator.

Other features and advantages of the present invention will be apparent from the following description taken in conjunction with the accompanying drawings.

BRIEF DESCRIPTION OF THE DRAWINGS

FIG. 7 is an explanatory view of the position at which a part of a soft decision data is cut off;

FIGS. 8A and 8B are explanatory views of a repetition regenerator;

FIGS. 16A and 16B are explanatory views of the structures of the data channel, and the control channel, respectively, of the up link;

FIG. 22 is a first explanation table of bits to be repeated in accordance with a repetition algorithm;

FIG. 23 is a second explanation table of bits to be repeated in accordance with a repetition algorithm shows the structure of a conventional transmitting apparatus;

FIG. 24 is a third explanation table of bits to be repeated in accordance with a repetition algorithm;

FIG. 25 is a fourth explanation table of bits to be repeated in accordance with a repetition algorithm;

Figure 1:
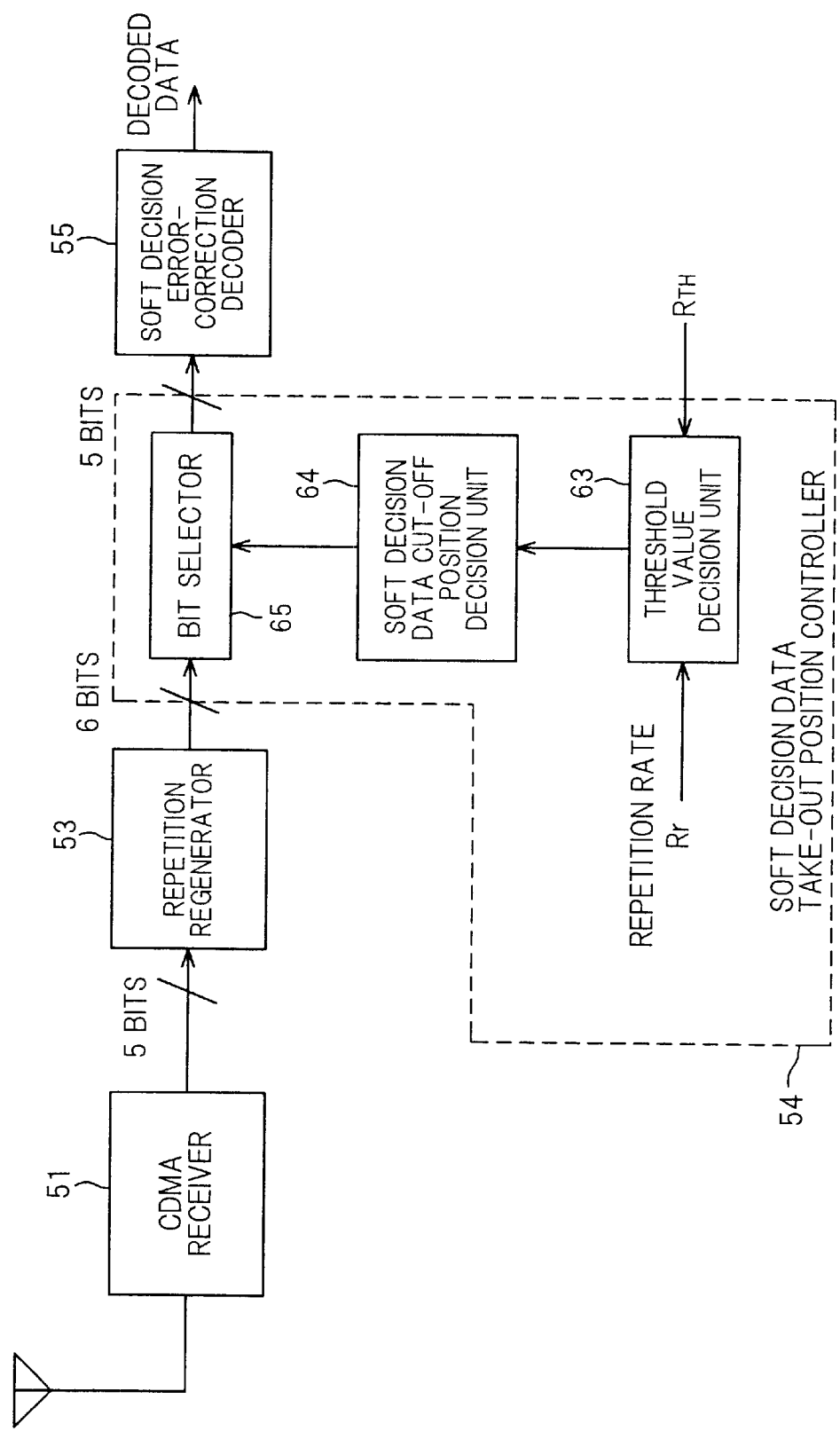
FIG. 1 schematically shows the structure of a first embodiment of an error correcting apparatus according to the present invention.

DESCRIPTION OF THE PREFERRED EMBODIMENTS (A) Schematic Explanation of a First Embodiment FIG. 1 schematically shows the structure of a first embodiment of the present invention.

A CDMA receiver 51 subjects a received signal to a processing such as demodulation, dispreading and Rake combination, and outputs a soft decision data of m (=5) bits (a sign bit+4 soft decision bits). A repetition regenerator 53 obtains the positions of the bits which are repeatedly transmitted in accordance with a repetition regeneration algorithm, adds a soft decision data which corresponds to the positions of the bits, and generates a soft decision data train of (m+1)(=6) bits which corresponds to the original error-correction code train. A threshold value decision unit 63 in a soft decision data take-out position controller 54 compares the repetition rate Rr of the received signal with a preset repetition rate $R_{TH}$, and inputs the result of comparison into a soft decision data cut-off position decision unit 64.

If Rr>$R_{TH}$, the soft decision data cut-off position decision unit 64 instructs a bit selector 65 to cut off the sign bit and the upper (m−1) bits. On the other hand, if Rr≦$R_{TH}$, the soft decision data cut-off position decision unit 64 instructs the bit selector 65 to cut off the sign bit and the lower (m−1) bits. In accordance with the instruction, if Rr>$R_{TH}$, the bit selector 65 cuts off the sign bit and the upper (m−1) bits from the soft decision data of (m+1) bits which is produced from the repetition regenerator 53, and inputs them into the soft decision error-correction decoder 55, while if Rr≦$R_{TH}$, the bit selector 65 cuts off the sign bit and the lower (m−1) bits from the soft decision data of (m+1) bits which is produced from the repetition regenerator 53, and inputs them into the soft decision error-correction decoder 55. The soft decision error-correction decoder 55 subjects the input soft decision data to an error-correction decoding processing so as to restore it to the original data train before the error-correction coding processing.

Figure 2:
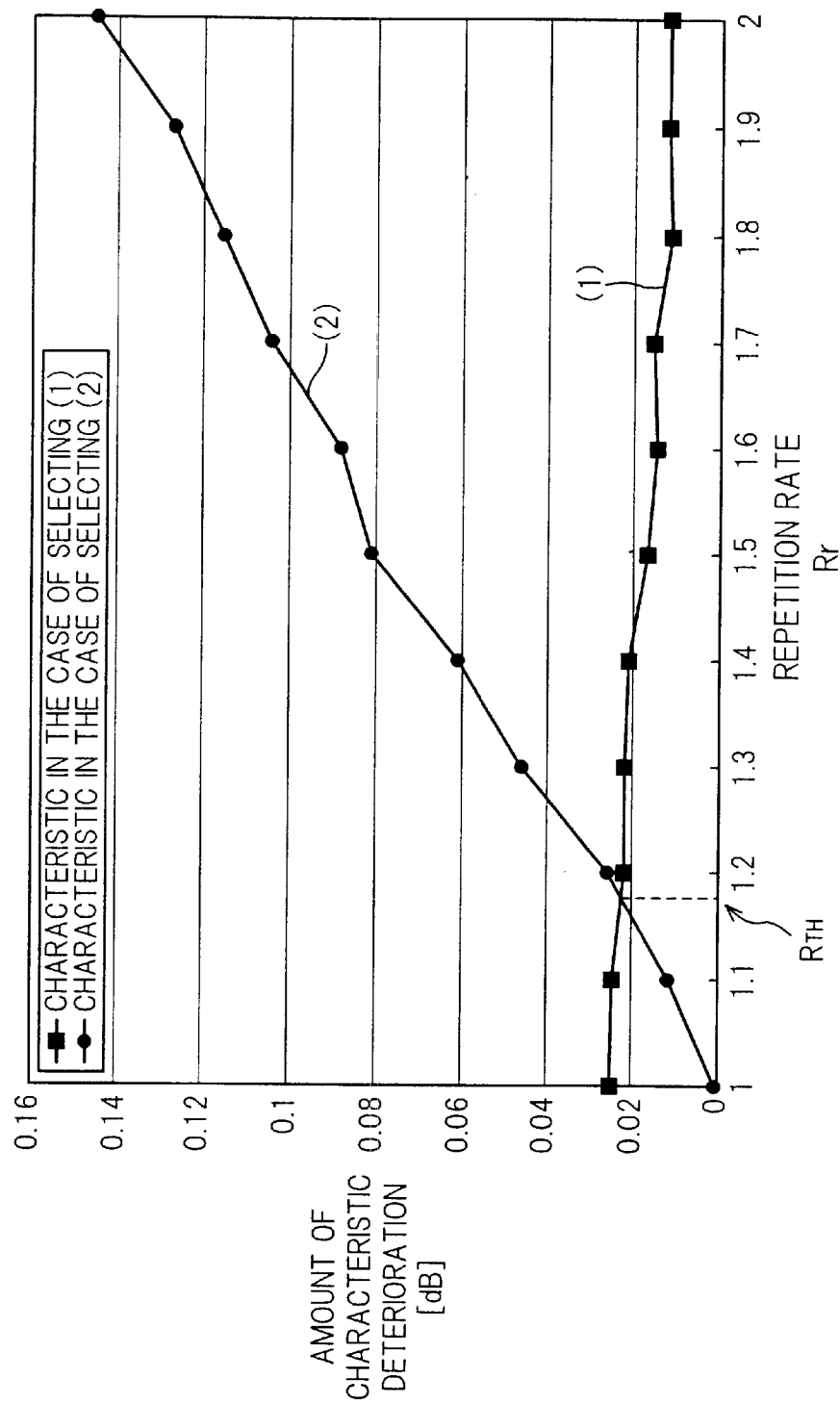
FIG. 2 shows the relationship between a repetition rate and the characteristic deterioration.
Figure 3:
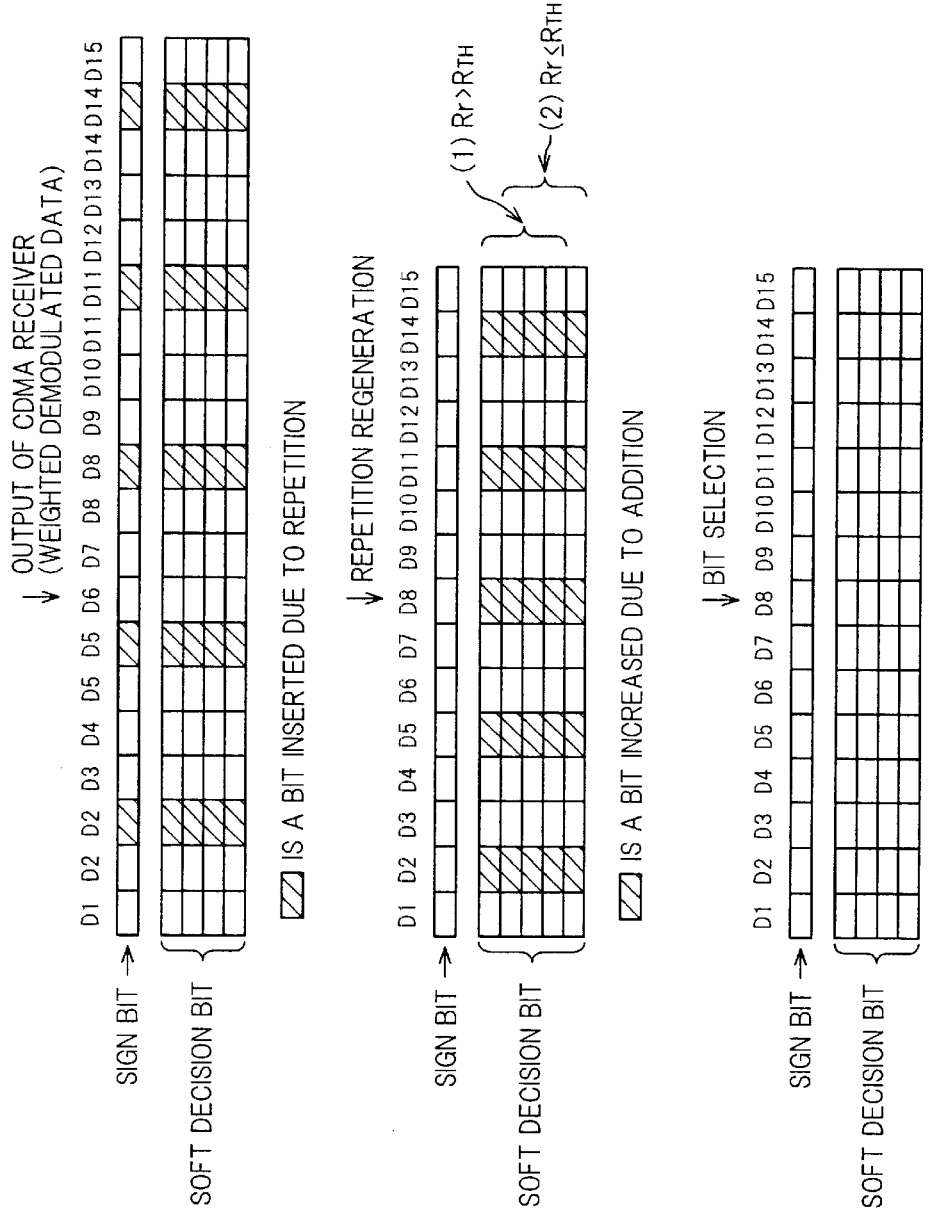
FIG. 3 is an explanatory view of the repetition regeneration and the selection of a soft decision bit in the first embodiment.

When m=5, the relationship between the repetition rate and the amount of characteristic deterioration is as shown in FIG. 2. That is, in the case (1) of selecting the upper (m−1)(=4) bits from the repetition regenerator 53, as the repetition rate Rr becomes smaller, the deterioration of error correcting characteristic increases. In the case (2) of selecting the lower (m−1) bits, as the repetition rate Rr becomes larger, the deterioration of error correcting characteristic increases. Therefore, the repetition rate at which the characteristic curves in (1) and (2) cross each other is set as a threshold value $R_{TH}$, and the cut-off position is switched on the basis of the result of comparison between the actual repetition rate Rr and the threshold value $R_{TH}$. For example, as shown in FIG. 3, (1) when the actual repetition rate Rr is larger than $R_{TH}$ (Rr>$R_{TH}$), the sign bit and the upper 4 bits are cut off and input into the soft decision error-correction decoder 55, while (2) when Rr≦$R_{TH}$, the sign bit and the lower 4 bits are cut off and input into the soft decision error-correction decoder 55.

In this manner, it is possible to suppress the characteristic deterioration to a small extent by switching the position at which a part of the soft decision data is cut off on the basis of the repetition rate Rr.

(B) Schematic Explanation of a Second Embodiment

Figure 4:
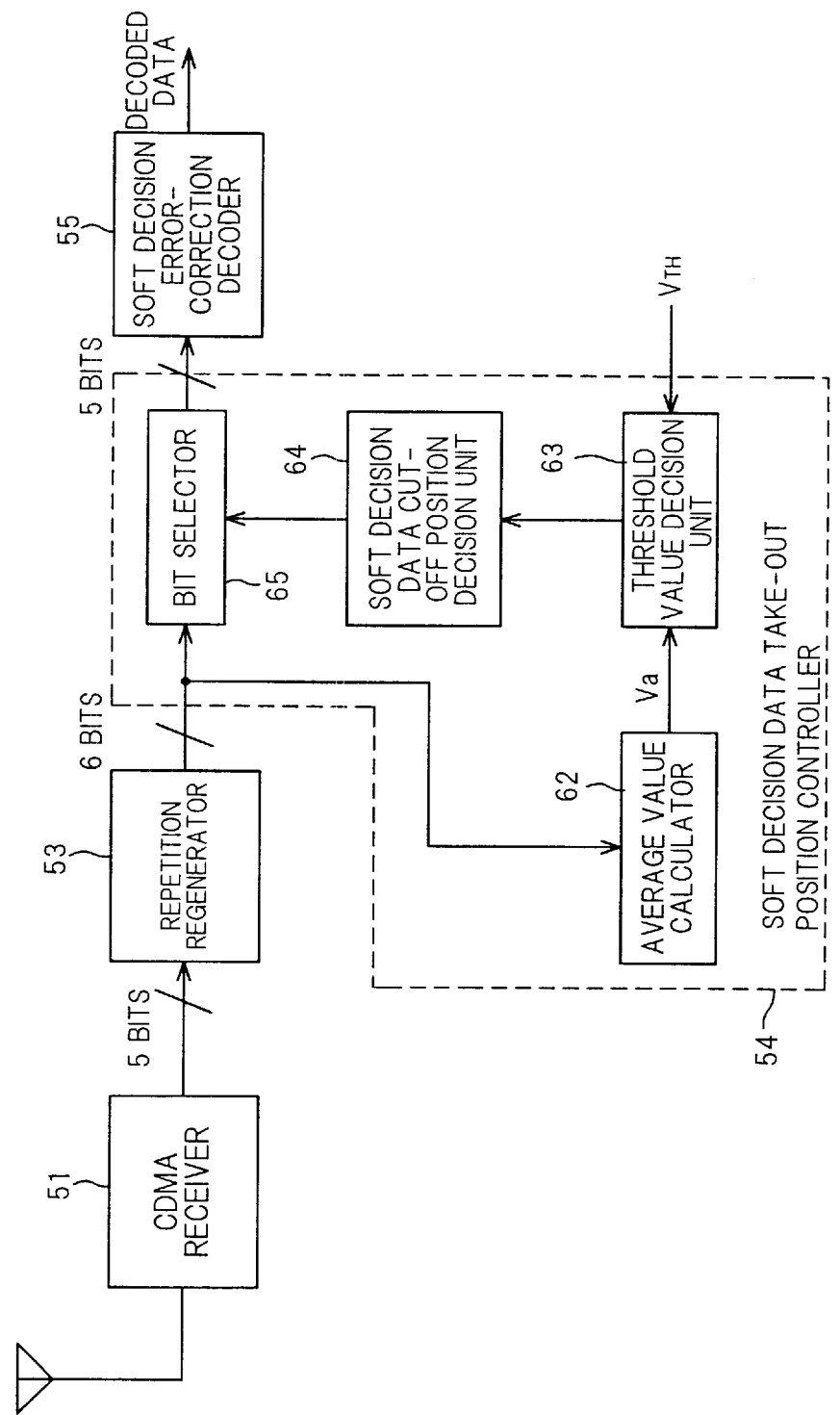
FIG. 4 schematically shows the structure of a second embodiment of an error correcting apparatus according to the present invention.

FIG. 4 schematically shows the structure of a second embodiment of the present invention.

The CDMA receiver 51 subjects a received signal to a processing such as demodulation, dispreading and Rake combination, and outputs a soft decision data of m (=5) bits (a sign bit+4 soft decision bits). The repetition regenerator 53 obtains the positions of the bits which are repeatedly transmitted in accordance with a repetition regeneration algorithm, adds a soft decision data which corresponds to the positions of the bits, and generates a soft decision data train of (m+1)(=6) bits which corresponds to the original error-correction code train. An average value calculator 62 in the soft decision data take-out position controller 54 calculates the average value Va of the soft decision data which is output from the repetition regenerator 53, and the threshold value decision unit 63 compares the average value Va with a preset average value $V_{TH}$, and inputs the result into the soft decision data cut-off position decision unit 64.

If Va>$V_{TH}$, the soft decision data cut-off position decision unit 64 instructs the bit selector 65 to cut off the sign bit and the lower (m−1) bits. On the other hand, if Va≦$V_{TH}$, the soft decision data cut-off position decision unit 64 instructs the bit selector 65 to cut off the sign bit and the upper (m−1) bits. In accordance with the instruction, if Va>$V_{TH}$, the bit selector 65 cuts off the sign bit and the upper (m−1) bits from the soft decision data of (m+1) bits which is produced from the repetition regenerator 53, and inputs them into the soft decision error-correction decoder 55, while if Va≦$V_{TH}$, the bit selector 65 cuts off the sign bit and the lower (m−1) bits from the soft decision data of (m+1) bits which is produced from the repetition regenerator 53, and inputs them into the soft decision error-correction decoder 55. The soft decision error-correction decoder 55 subjects the input soft decision data to an error-correction decoding processing so as to restore it to the original data train before the error-correction coding processing.

Figure 5:
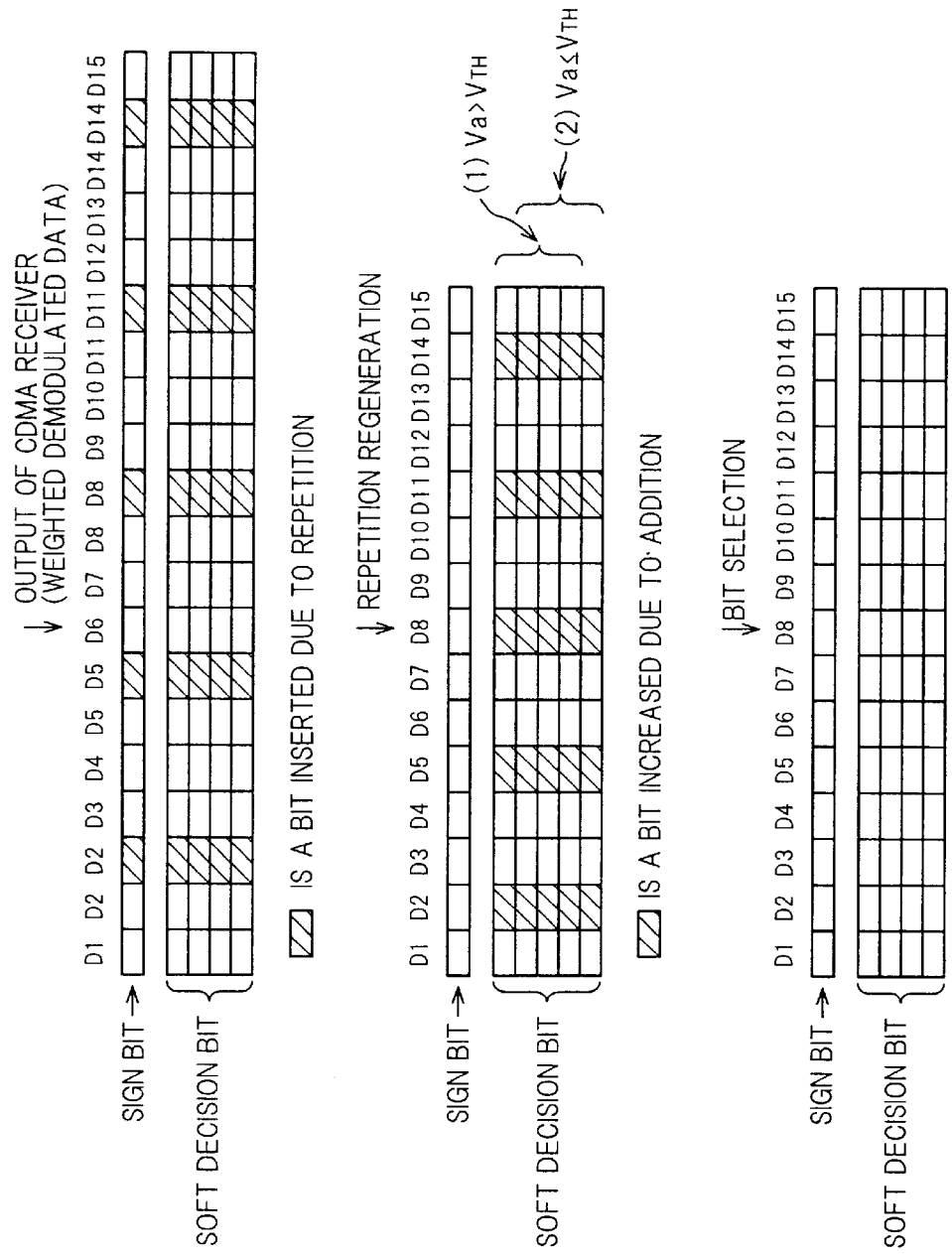
FIG. 5 is an explanatory view of the repetition regeneration and the selection of a soft decision bit in the second embodiment.

As the repetition rate increases, the average value of the soft decision data increases, while as the repetition rate decreases, the average value of the soft decision data decreases. It is therefore possible to substitute the average value for the repetition rate in the first embodiment. In other words, the average value of the soft decision data which corresponds to the repetition rate $R_{TH}$ at which the characteristic curves cross each other in the first embodiment is set as a threshold value $V_{TH}$, and the position at which the part of the soft decision data is cut off is switched on the basis of the result of comparison of the actual average value Va and the threshold value $V_{TH}$. For example, as shown in FIG. 5, (1) when the actual average value Va is larger than $V_{TH}$ (Va>$V_{TH}$), the sign bit and the upper 4 bits are cut off and input into the soft decision error-correction decoder 55, while (2) when Va≦$V_{TH}$, the sign bit and the lower 4 bits are cut off and input into the soft decision error-correction decoder 55.

In this manner, it is possible to suppress the characteristic deterioration to a small extent as in the first embodiment, by switching the position at which a part of the soft decision data is cut off on the basis of the average value Va of the soft decision data output from the repetition regenerator 53.

(C) First Embodiment (a) Structure

Figure 6:
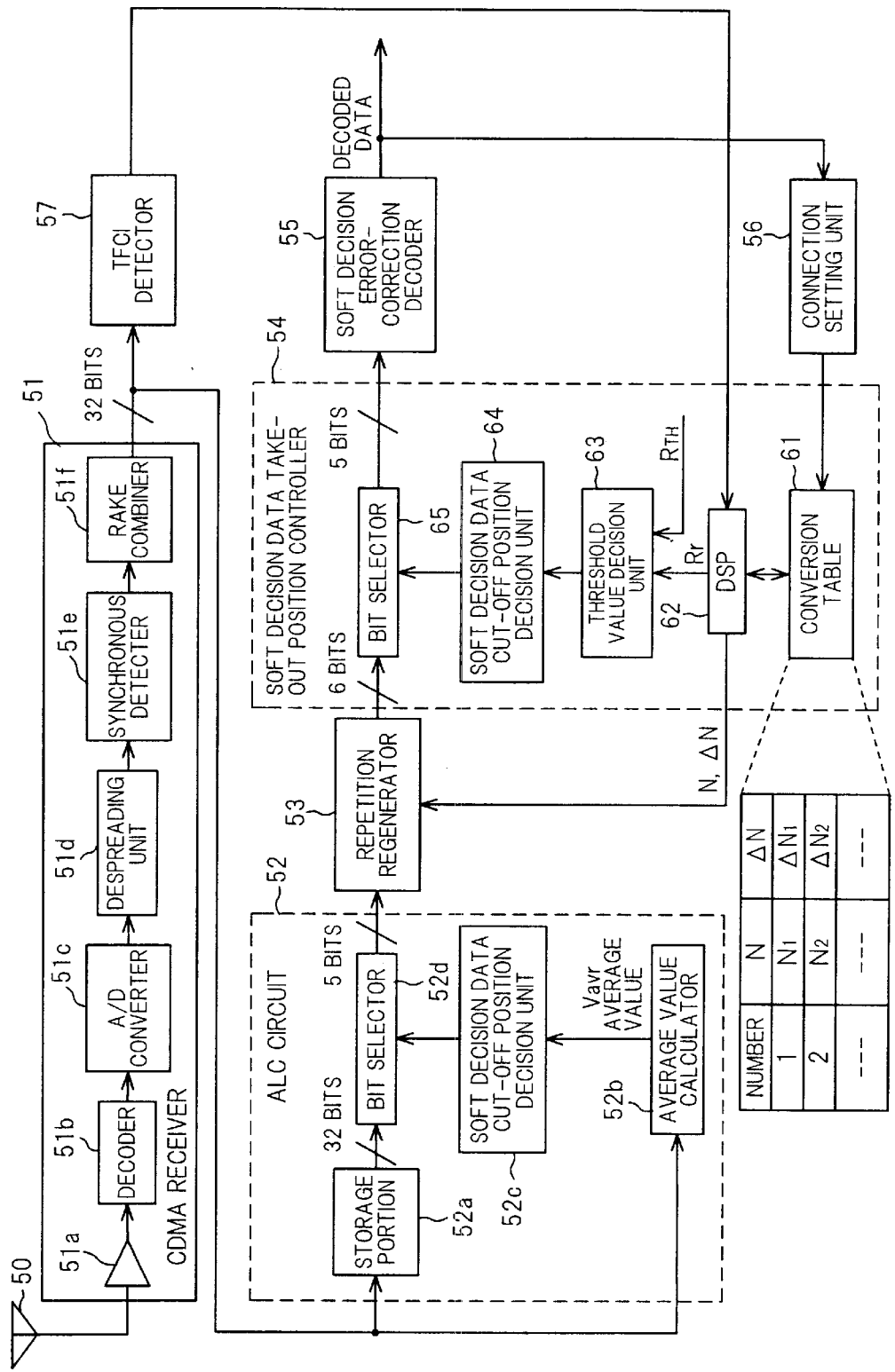
FIG. 6 shows the structure of the first embodiment of an error correcting apparatus according to the present invention.
Figure 14:
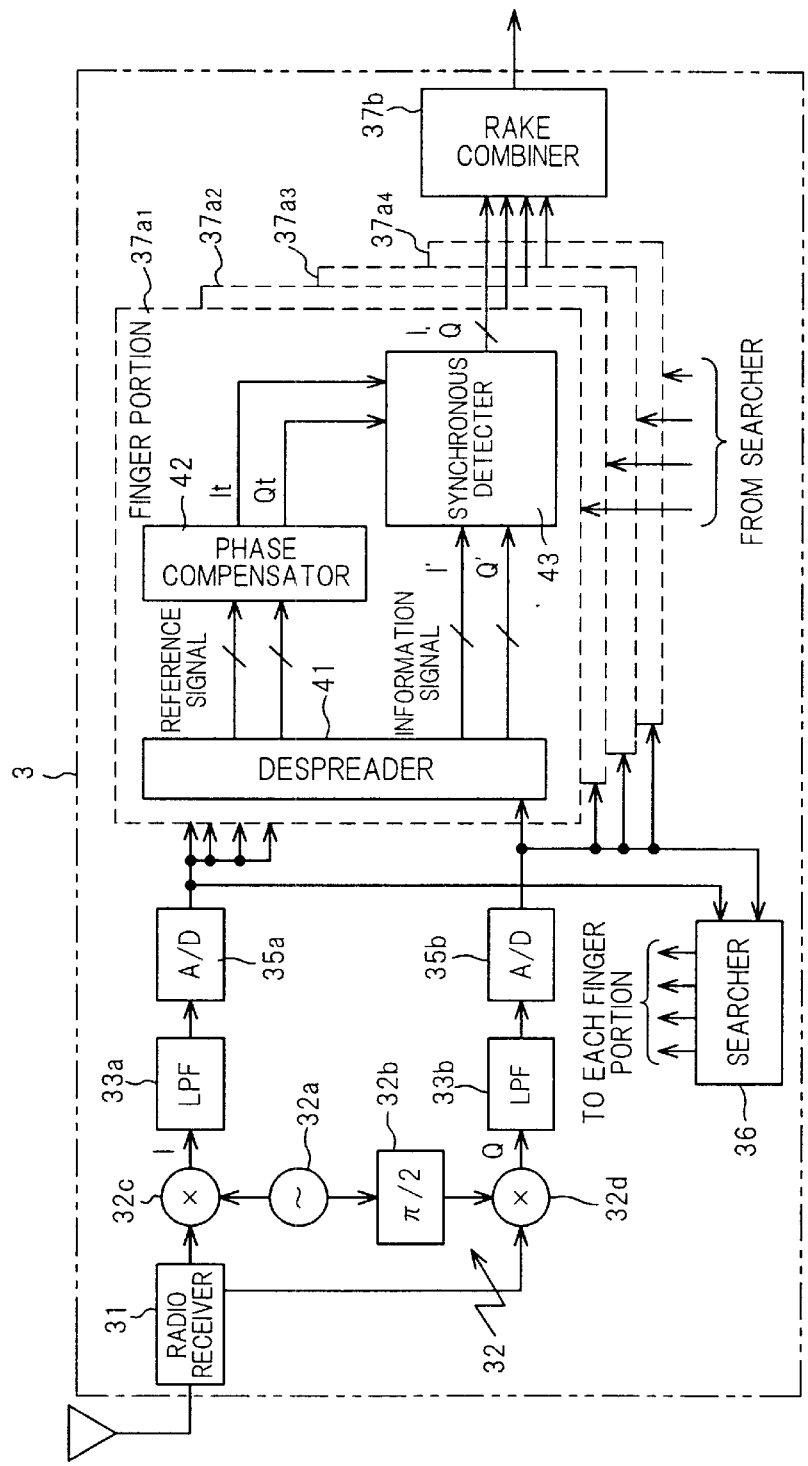
FIG. 14 shows the structure of a CDMA receiver.
Figures 17A, 17B:
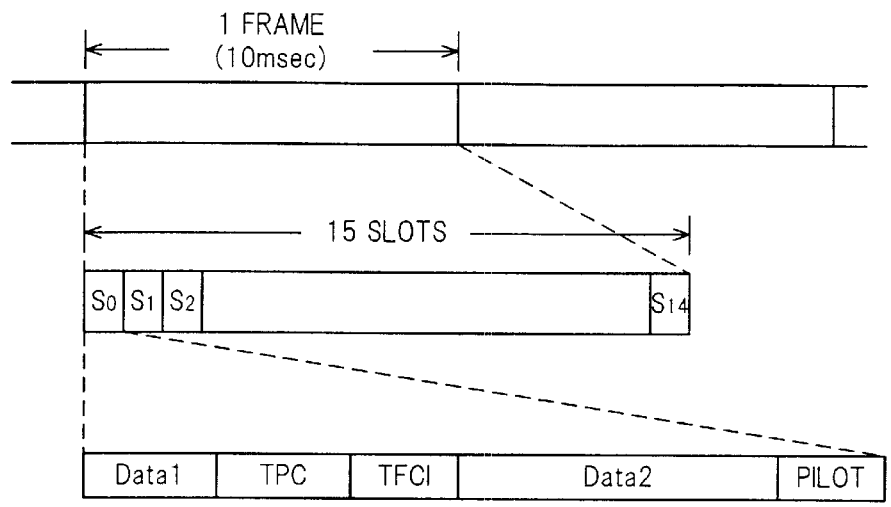
FIGS. 17A and 17B are explanatory views of the structures of the data channel, and the control channel, respectively, of a down link.
Figure 18:
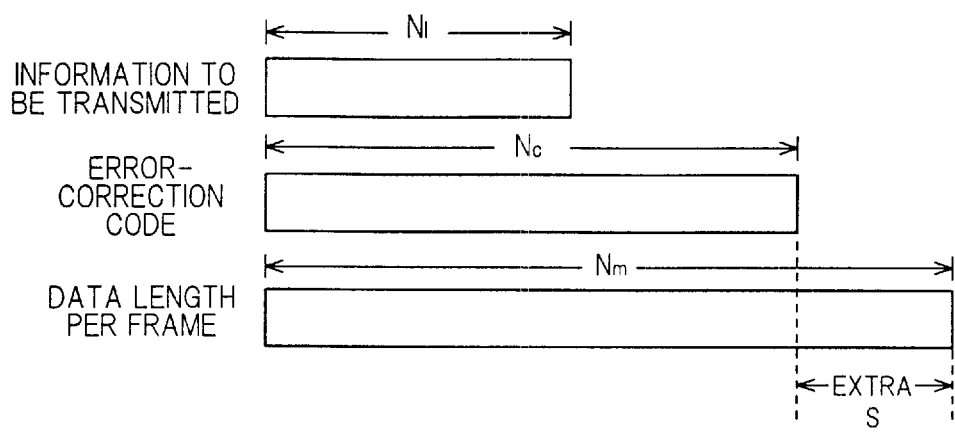
FIG. 18 is an explanatory view of the necessity of a repetition processing.
Figure 19A:
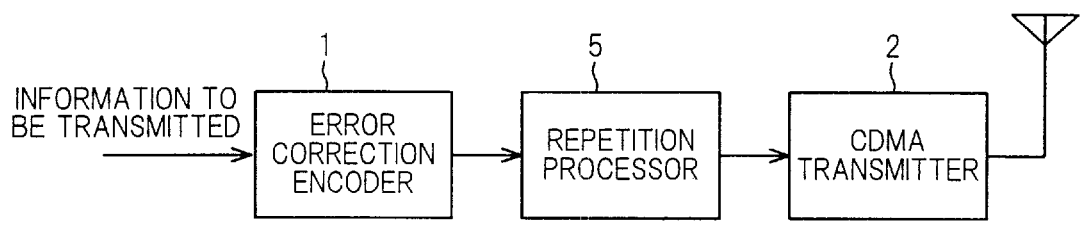
FIGS. 19A and 19B show the structures of another conventional transmission system and another conventional reception system, respectively.
Figure 19B:
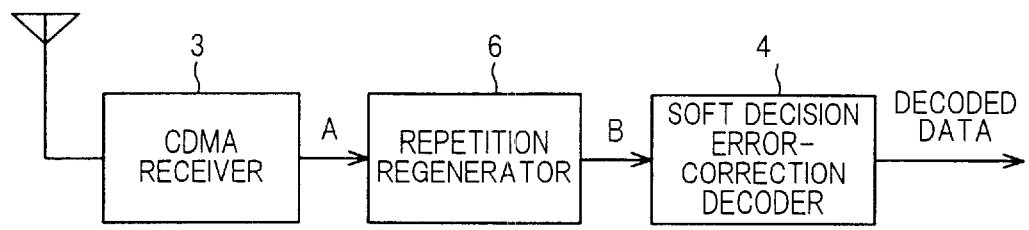
Figure 20:
FIG. 20 is an explanatory view of a repetition processing.
Figure 21:
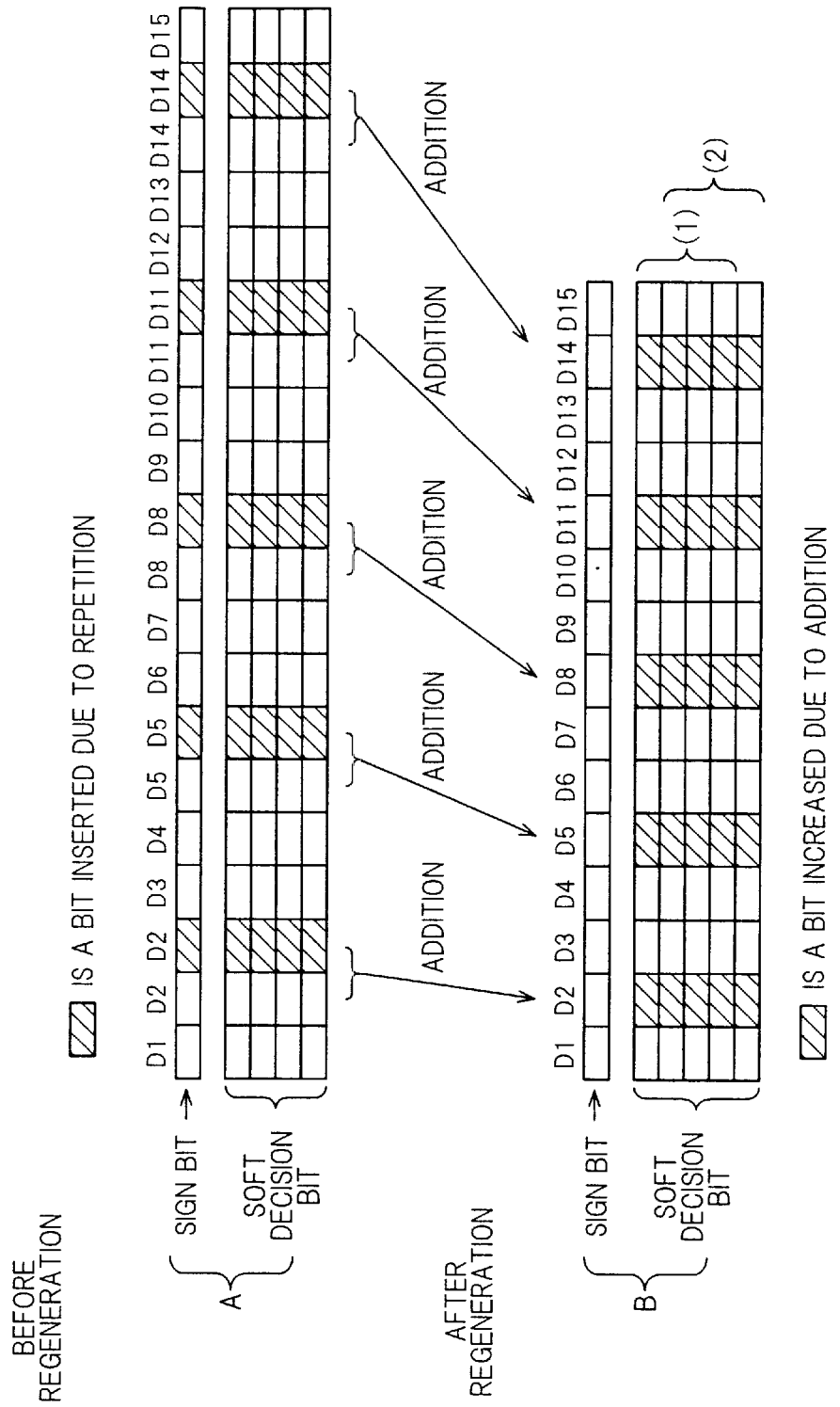
FIG. 21 is an explanatory view of a repetition regeneration processing.
Figures 26, 27:
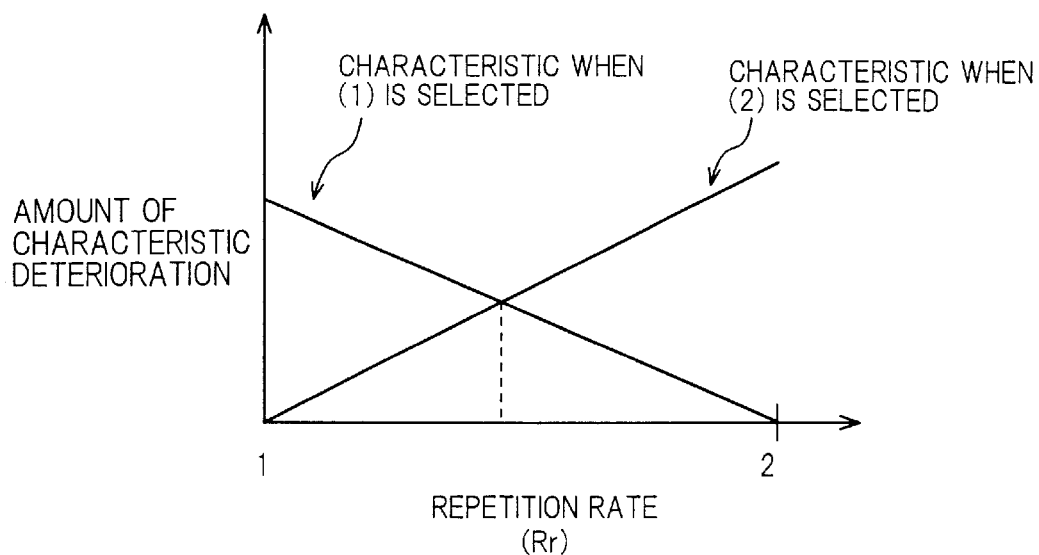
FIG. 26 is a fifth explanation table of bits to be repeated in accordance with a repetition algorithm.
FIG. 27 shows the relationship between the repetition rate and the characteristic deterioration.
Figure 28:
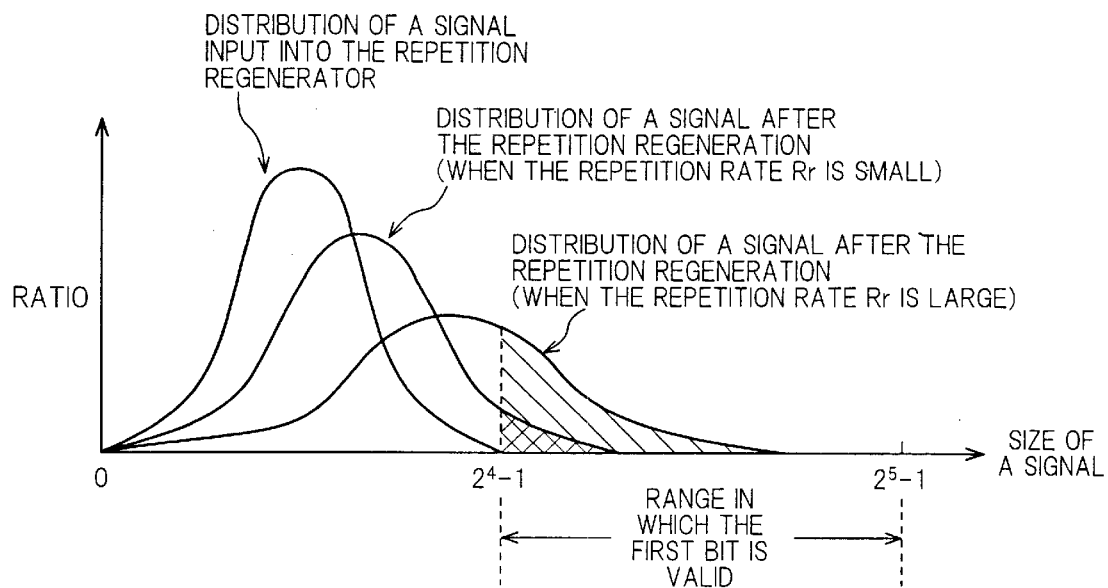
FIG. 28 is an explanatory view of the distribution of soft decision information before and after repetition regeneration.

FIG. 6 shows the structure of the first embodiment of an error-correction apparatus according to the present invention. The same reference numerals are provided for the elements which are the same as those shown in FIG. 1. The CDMA receiver 51 has the structure similar to that explained with reference to FIG. 14. More specifically, the CDMA receiver 51 includes a radio circuit 51a for amplifying a high-frequency signal received from an antenna 50, converting the frequency of the high-frequency signal into the frequency of a baseband signal and outputting the baseband signal, a quadrature detector (demodulator) 51b for subjecting the baseband signal to quadrature detection, an AD converter 51c for converting the output signals (an I component signal and a Q component signal) of the quadrature detector 51b into digital signals, a despreading unit 51d for subjecting the I component signal and the Q component signal which are output from the quadrature detector 51b to a despreading processing, a synchronous detector 51e for applying a synchronous detection processing to the despread data by using a pilot signal, and a Rake combiner 51f for combining the outputs of the synchronous detector 51e in accordance with the respective multi paths and outputting the result of combination as a soft decision data of 32 bits.

An ALC (Automatic Level Control) circuit 52 calculates the average values Vavr of the soft decision data which is input from the Rake combiner 51f, cuts off the part of the soft decision data which corresponds to the average values Vavr and inputs it into the repetition regenerator 53. In the ALC circuit 52, a storage portion 52a stores the soft decision data of 1 frame which is output from the Rake combiner 51f, an average value calculator 52b calculates the average values Vavr of the soft decision data for 1 frame, for example, and a soft decision data cut-off position decision unit 52c decides the position at which a part of the soft decision data is cut off on the basis of the average value Vavr in such a manner that the original data can be faithfully represented even if the number of bits is reduced. A bit selector 52d sequentially reads the soft decision data of 32 bits out of the storage portion 52a, cuts off the data of 5 bits (the sign bit+4 soft decision bits) from the decided position and inputs it into the repetition regenerator 53. The bit cut-off position is decided, for example, in such a manner that the most significant upper bit position at which the binary average value Vavr is "1", is situated at the third bit of 4 soft decision bits, as shown in FIG. 7.

The repetition regenerator 53 obtains the positions of the bits which are repeatedly transmitted due to a repetition processing, adds the soft decision data corresponding to the positions of the bits and generates a soft decision data train of 6 bits corresponding to the original error-correction data train. FIG. 8A shows the structure of the repetition regenerator 53, and FIG. 8B is an explanatory view of the condition for selecting an input signal. A repetition algorithm executor 53a executes a repetition algorithm by using N (number of bits per frame before the repetition) and ΔN (number of bits increased due to the repetition) which will be described later, and outputs a repeat signal RIS=1 (see FIGS. 22 to 26) at the positions of the bits which are repeatedly transmitted. A register 53b stores a soft decision data A output from the ALC circuit 52, and an adder 53c adds the precedent and current soft decision data. A selector 53d (1) outputs a soft decision data A of 6 bits, if RIS="0" at both the precedent time and the current time ("0"→"0"), (2) outputs nothing, if RIS="1" at the current time, and (3) selects and outputs the result B of the addition of 6 bits, if RIS="1" at the precedent time and RIS="0" at the current time precedent data ("1"→"0"). Alternatively, it is possible to constitute the repetition regenerator 53 in the form of a software including the addition processing and the selection processing.

Returning to FIG. 6, the soft decision data take-out position controller 54 cuts off the part of the soft decision data of 5 bits from the soft decision data of 6 bits which is generated by the repetition regenerator 53, on the basis of the repetition rate Rr. In the soft decision data take-out position controller 54, a conversion table 61 stores N (number of bits per frame before the repetition) and ΔN (number of bits increased due to the repetition) in correspondence with the result of a TFCI analysis, that is, the conversion table 61 is created on the basis of the information TFCI transmitted from the communication party in the negotiation before the start of communication.

A DSP (Digital Signal Processor) 62 (1) analyzes TFCI bits for 1 frame, and obtains N and ΔN used for the repetition processing of the transmission side by referring to the analyzed TFCI (number) and the conversion table 61, (2) inputs N and ΔN into the repetition regenerator 53, and (3) calculates the repetition rate Rr from the following formula:

$$Rr=(N+\Delta N)/N$$

and outputs the result. N and ΔN during the negotiation are fixed in advance. However, N and ΔN can be changed during communication, and the transmission side transmits the number of TFCI bits corresponding to N and ΔN, while the DSP on the reception side identifies the number of the TFCI bits and executes the above-described processing.

The threshold value decision unit 63 compares the repetition rate Rr of the received signal with a preset repetition rate $R_{TH}$, and inputs the result of comparison into the soft decision data cut-off position decision unit 64. If $Rr>R_{TH}$, the soft decision data cut-off position decision unit 64 instructs the bit selector 65 to cut off the sign bit and the upper 4 bits. On the other hand, if $Rr \leq R_{TH}$, the soft decision data cut-off position decision unit 64 instructs the bit selector 65 to cut off the sign bit and the lower 4 bits.

In accordance with the instruction, if $Rr>R_{TH}$, the bit selector 65 cuts off the sign bit and the upper 4 bits from the soft decision data of 6 bits which is generated by the repetition regenerator 53, and inputs them into the soft decision error-correction decoder 55, while if $Rr \leq R_{TH}$, the bit selector 65 cuts off the sign bit and the lower 4 bits from the soft decision data of 6 bits which is generated by the repetition regenerator 53, and inputs them into the soft decision error-correction decoder 55.

The soft decision error-correction decoder 55 subjects the input soft decision data to an error-correction decoding processing so as to restore it to the original data train. A connection setting unit 56 creates the conversion table 61 on the basis of the information (decoded data) transmitted from the transmission side in the negotiation before the start of communication. A TFCI detector 57 detects TFCI bits and transmits them to the DSP 62.

(b) Operation

At the time of negotiation before the start of communication, the DSP 62 inputs $N_0$ and $\Delta N_0$, which are set in advance as N and ΔN, into the repetition regenerator 53, and also inputs a repetition rate $Rr_0$ calculated by using $N_0$, $\Delta N_0$ into the threshold value decision unit 63. The CDMA receiver 51 outputs the received signal in the form of a soft decision data train of 32 bits, and the ALC circuit 52 cuts off the part of the soft decision data of 5 bits at the cut-off position corresponding to the average value Vavr of the soft decision data, and inputs it into the repetition regenerator 53. The repetition regenerator 53 obtains the positions of the bits which are repeatedly transmitted by executing the repetition regeneration algorithm on the basis of $N_0$, $\Delta N_0$, and generates a soft decision data train of 6 bits which corresponds to the original error-correction code train by adding the soft decision data corresponding to the positions of the bits. The soft decision data take-out position controller 54 cuts off the sign bit and the upper 4 bits or the sign bit and the lower 4 bits on the basis of the result of comparison between the repetition rate $Rr_0$ and the preset repetition rate $R_{TH}$, and inputs the cut bits into the soft decision error-correction decoder 55. The soft decision error-correction decoder 55 subjects the input soft decision data to an error-correction decoding processing and outputs the decoded data. The connection setting unit 56 creates the conversion table 61 from the decoded data and sets it in the soft decision data take-out position controller 54.

After the end of negotiation, the DSP 62 obtains N and ΔN corresponding to the number which is transmitted in the form of the TFCI bits, and inputs the N and ΔN obtained in the repetition regenerator 53. The DSP 62 also calculates the repetition rate Rr from the N and ΔN obtained and inputs it into the threshold value decision unit 63. The CDMA receiver 51 outputs the received signal in the form of a soft decision data train of 32 bits, and the ALC circuit 52 cuts off the part of the soft decision data of 5 bits at the cut-off position corresponding to the average value Vavr, and inputs it into the repetition regenerator 53. The repetition regenerator 53 obtains the positions of the bits which are repeatedly transmitted by executing the repetition algorithm on the basis of the input N, ΔN, and generates a soft decision data train of 6 bits which corresponds to the original error-correction code train by adding the soft decision data corresponding to the positions of the bits. The soft decision data take-out position controller 54 cuts off the sign bit and the upper 4 bits or the sign bit and the lower 4 bits on the basis of the result of comparison between the calculated repetition rate Rr and the preset repetition rate $R_{TH}$, and inputs the cut bits into the soft decision error-correction decoder 55. The soft decision error-correction decoder 55 subjects the input soft decision data to an error-correction decoding processing and outputs the decoded data.

In parallel with the above-described operation, the TFCI detector 57 detects TFCI bits and inputs them into the DSP 62. The DSP 62 analyzes the TFCI bits for 1 frame, and obtains N and ΔN by referring to the analyzed TFCI (number) and the conversion table 61. If the N and ΔN newly obtained are different from the current N and ΔN, the DSP 62 inputs the new N and ΔN into the repetition regenerator 53, calculates a new repetition rate Rr and inputs the result into the threshold value decision unit 63. Thenceforth, the CDMA receiver 51, the ALC circuit 52, the repetition regenerator 53, the soft decision data take-out position controller 54 and the soft decision error-correction decoder 55 repeat the above-described operation.

According to the first embodiment, it is possible to suppress the characteristic deterioration to a small extent by switching the position at which a part of the soft decision data is cut off on the basis of the repetition rate Rr.

(c) Modification

Figure 9:
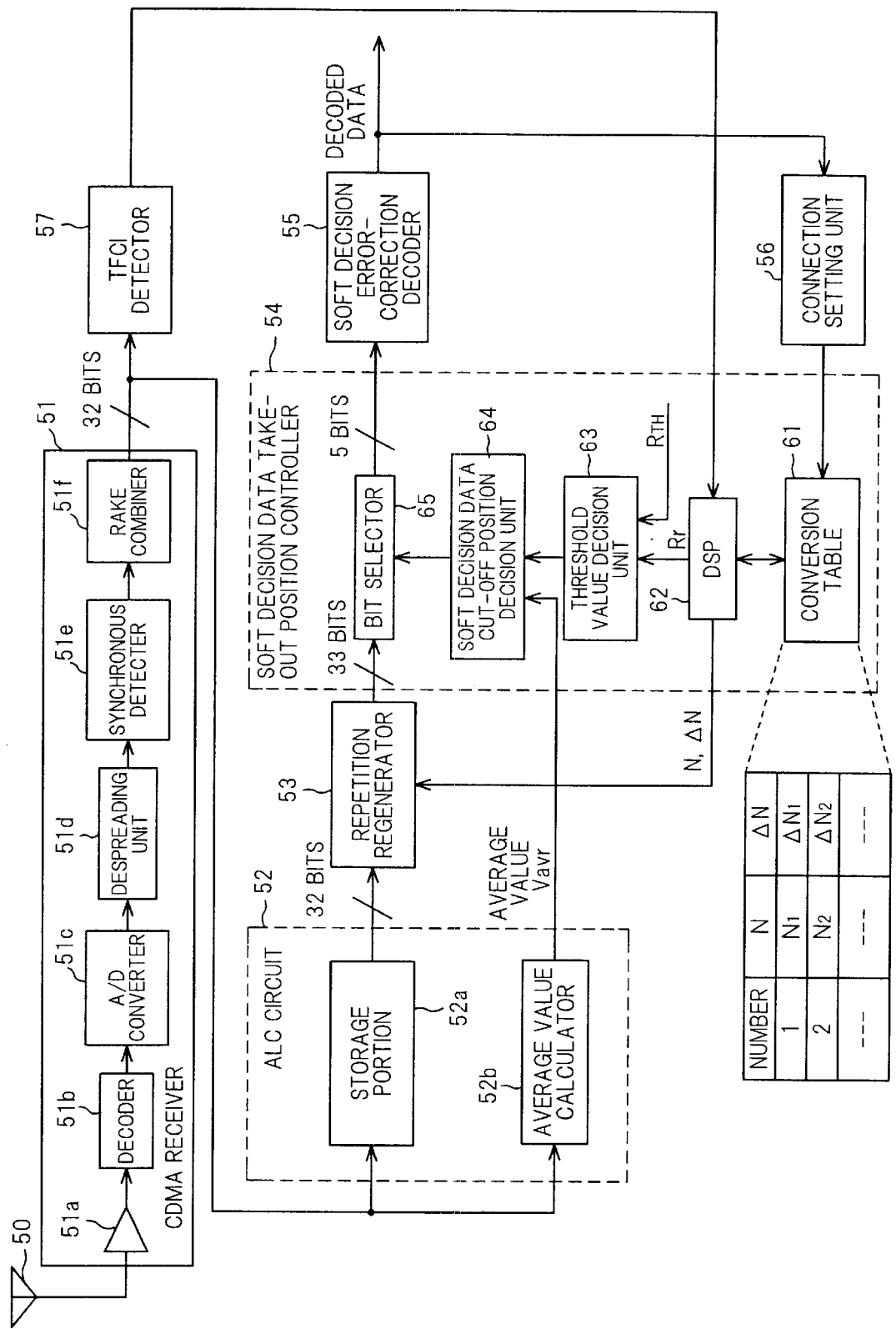
FIG. 9 shows a modification of the first embodiment of an error-correction apparatus.

FIG. 9 shows a modification of the first embodiment. The same reference numerals are provided for the elements which are the same as those in the first embodiment shown in FIG. 6. This modification is different from the first embodiment in the following points:

(1) that the ALC circuit 52 does not cut off a bit from the 32 bits of the soft decision data which is output from the Rake combiner 5 If;

(2) that the repetition regenerator 53 sequentially reads the soft decision data of 32 bits out of the storage portion 52a after the end of calculation of the average value Vavr of the soft decision data of 32 bits, executes a repetition regeneration processing and outputs the data in the form of a soft decision data of 33 bits;

(3) that the soft decision data cut-off position decision unit 64 decides the position at which a part of the soft decision data (4 soft decision bits) is cut off on the basis of the result of comparison between the repetition rate Rr and the preset repetition rate $R_{TH}$ and the average value Vavr of the soft decision data which is output from the average value calculator 52b; and (4) that the bit selector 65 cuts off the soft decision data of 5 bits (the sign bit+4 soft decision bits) out of the soft decision data of 33 bits which is output from the repetition regenerator 53 at the decided cut-off position.

The soft decision data cut-off position decision unit 64 decides the position at which a part of the soft decision data is cut off in such a manner (1) that the most significant upper bit at which the binary average value Vavr is "1", is situated at the third bit of 4 soft decision bits, if $Rr \leq R_{TH}$, and (2) that the most significant upper bit at which the binary average value Vavr is "1" is situated at the second bit of 4 soft decision bits, if $Rr > R_{TH}$.

According to this modification, it is possible to suppress the characteristic deterioration to a small extent and, in addition, to simplify the circuit structure by switching the position at which a part of the soft decision data is cut off on the basis of the repetition rate Rr.

(D) Second Embodiment

Figure 10:
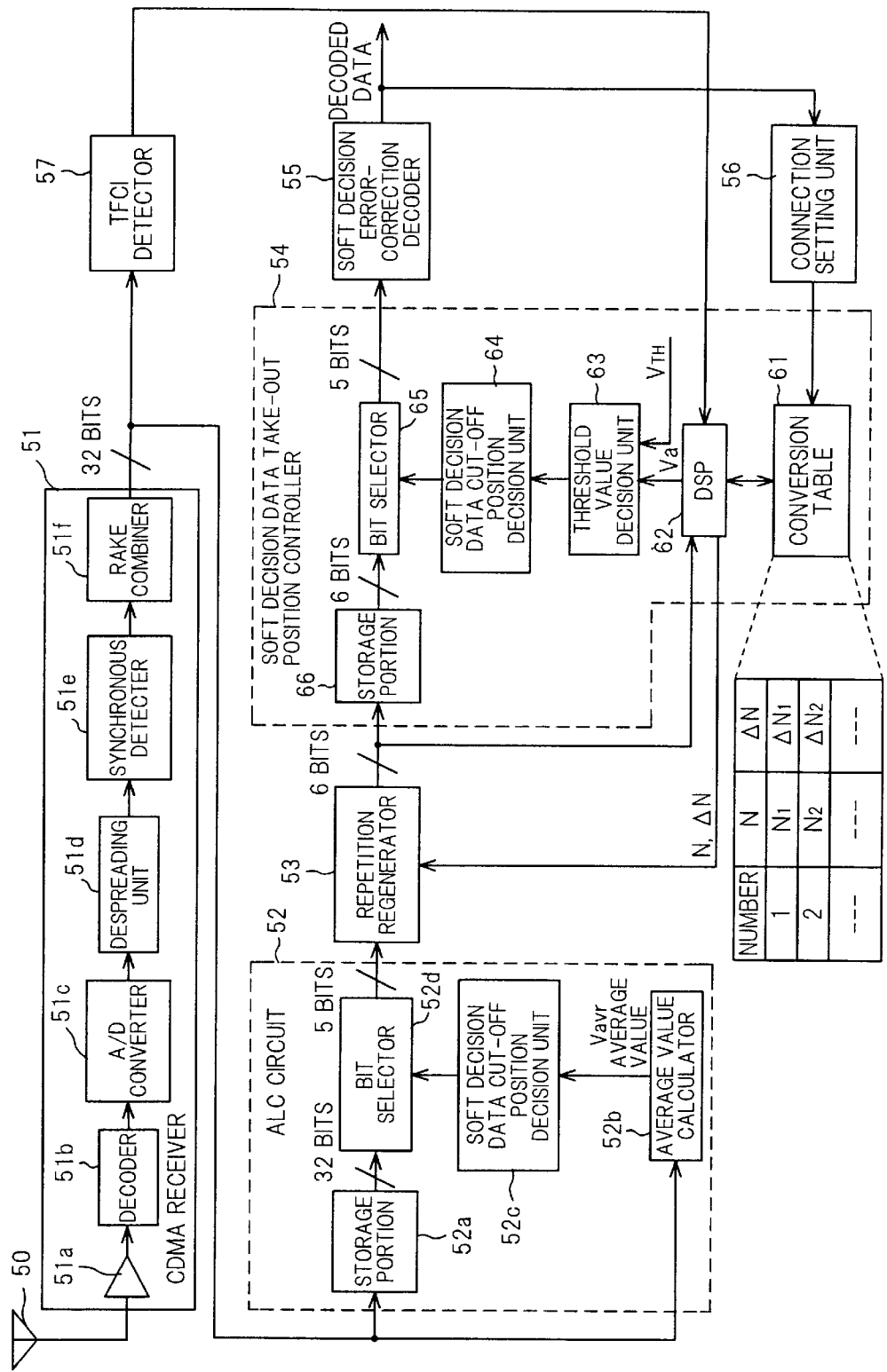
FIG. 10 shows the structure of a second embodiment of an error-correction apparatus according to the present invention.

FIG. 10 shows the structure of the second embodiment of an error correcting apparatus according to the present invention. The same reference numerals are provided for the elements which are the same as those in the first embodiment shown in FIG. 6. The second embodiment is different from the first embodiment in the following points:

(1) that the DSP 62 calculates the average value Va of the soft decision data of 6 bits which is out put from the repetition regenerator 53;

(2) that a storage portion 66 for storing the soft decision data for 1 frame is provided in the soft decision data take-out position controller 54;

(3) that the threshold value decision unit 63 compares the average value Va and a preset threshold value $V_{TH}$; and (4) that the soft decision data cut-off position decision unit 64 decides the position at which the soft decision data of 5 bits (the sign bit+4 soft decision bits) is cut off on the basis of the result of comparison between the average value Va and the preset threshold value $V_{TH}$.

The CDMA receiver 51 outputs a received signal in the form of a soft decision data train of 32 bits, and the ALC circuit 52 cuts off the part of soft decision data of 5 bits at the cut-off position which corresponds to the average value Vavr of the soft decision data, and inputs the cut data into the repetition regenerator 53. The repetition regenerator 53 executes a repetition algorithm so as to obtain the positions of the bits which are repeatedly transmitted, adds the soft decision data which corresponds to the positions of the bits, and outputs a soft decision data train of 6 bits which corresponds to the original error-correction code train.

The storage portion 66 of the soft decision data take-out position controller 54 sequentially stores the soft decision data output from the repetition regenerator 53, and the DSP 62 calculates the average value Va of the soft decision data for 1 frame.

When the calculation of the average value Va of the soft decision data for 1 frame is finished, the threshold value decision unit 63 compares the average value Va with the threshold value $V_{TH}$, and inputs the result into the soft decision data cut-off position decision unit 64. The soft decision data cut-off position decision unit 64 instructs the bit selector 65 to cut off the sign bit and the upper 4 bits, if $Va > V_{TH}$, while if $Va \leq V_{TH}$, the soft decision data cut-off position decision unit 64 instructs the bit selector 65 to cut off the sign bit and the lower 4 bits.

In accordance with the instruction, if $Va > V_{TH}$, the bit selector 65 sequentially reads out the soft decision data of 6 bits, cuts off the sign bit and the upper 4 bits, and inputs them into the soft decision error-correction decoder 55, while if $Va \leq V_{TH}$, the bit selector 65 cuts off the sign bit and the lower 4 bits, and inputs them into the soft decision error-correction decoder 55.

The soft decision error-correction decoder 55 subjects the input soft decision data to an error-correction decoding processing so as to restore it to the original data train before the error-correction coding processing.

As described above, it is possible to suppress the characteristic deterioration to a small extent by switching the position at which a part of the soft decision data is cut off on the basis of the average value Va of the soft decision data which is output from the repetition regenerator 53.

Figure 11:
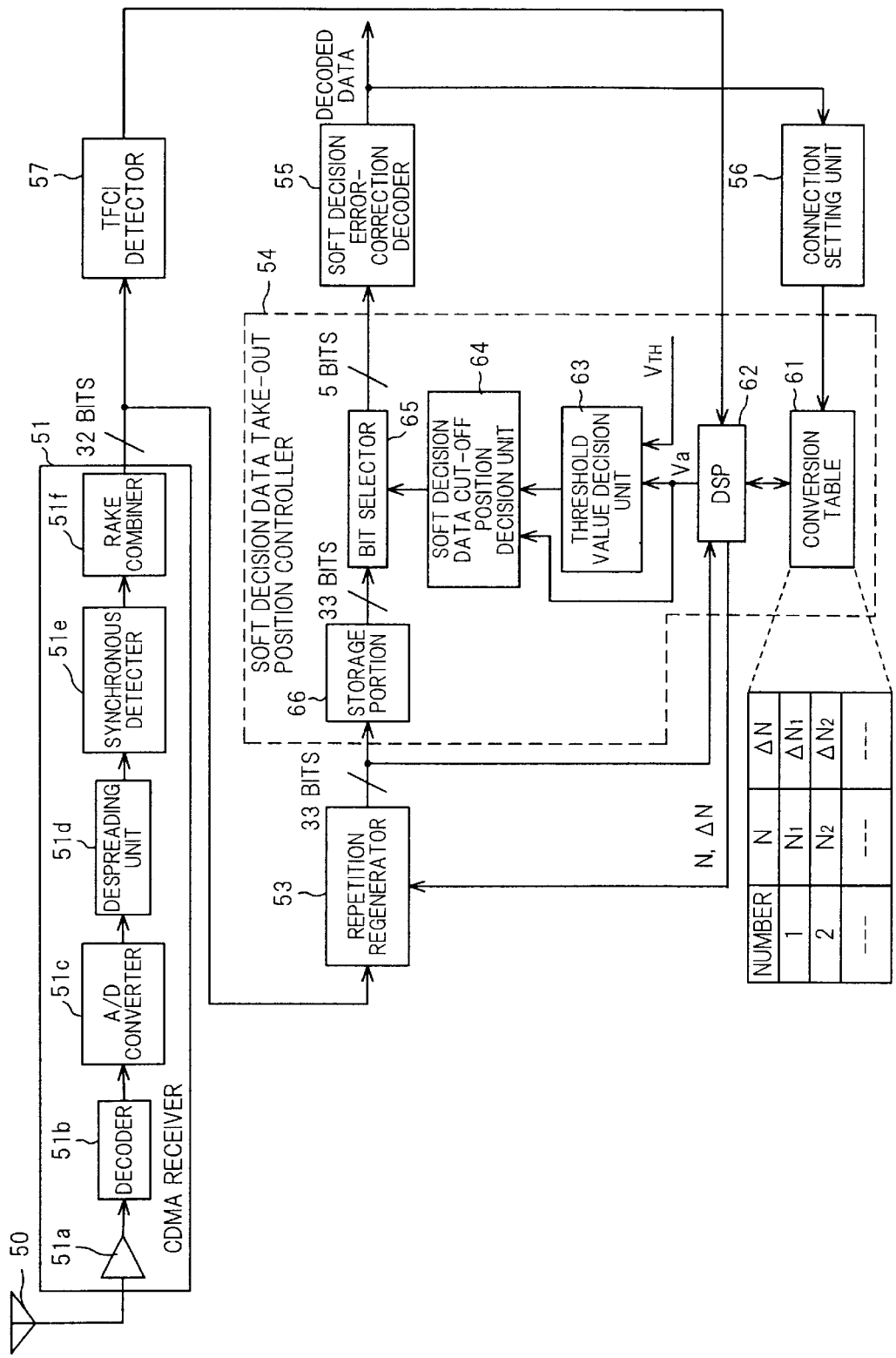
FIG. 11 shows a modification of the second embodiment of an error-correction apparatus.
Figure 12A:
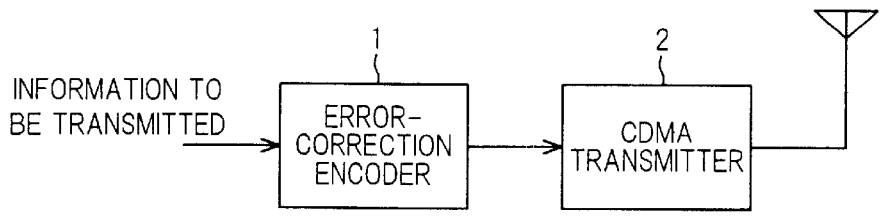
FIGS. 12A and 12B schematically show the structures of a conventional transmission system and a reception system, respectively.
Figure 12B:
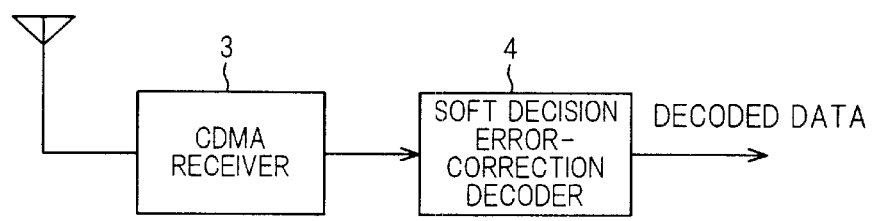
Figure 15:
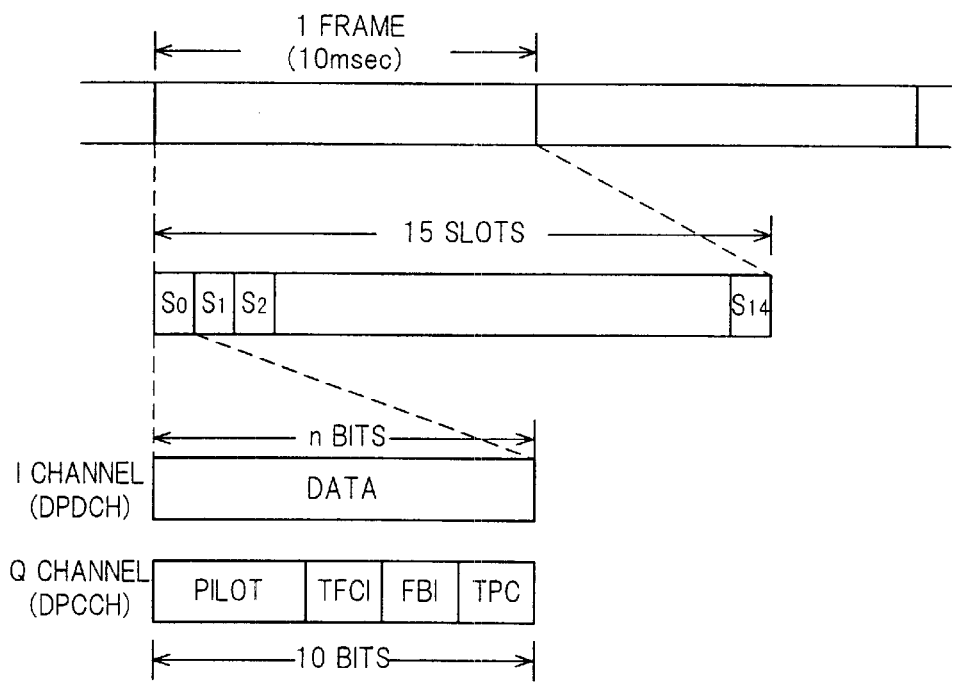
FIG. 15 is an explanatory view of the frame format of an up link.
Figure 13:
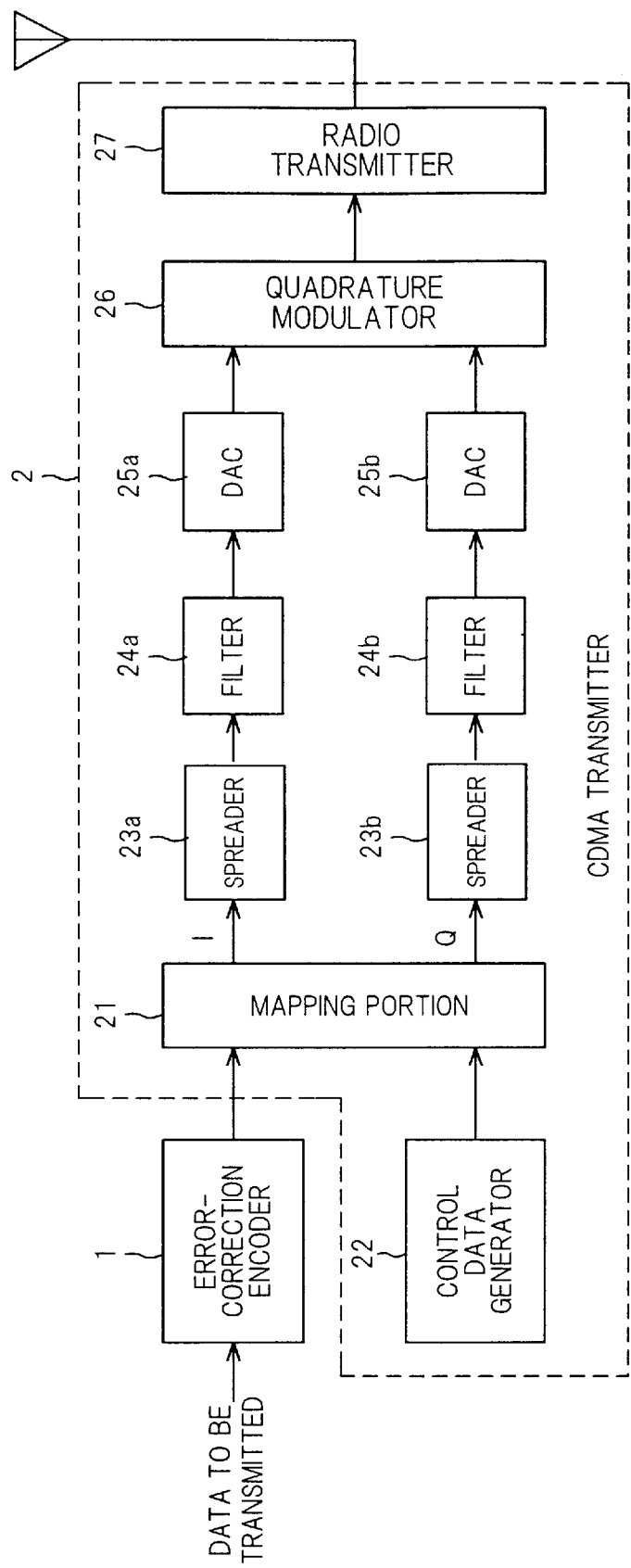
FIG. 13 shows the structure of a CDMA transmitting apparatus.

FIG. 11 shows a modification of the second embodiment. The same reference numerals are provided for the elements which are the same as those in the second embodiment shown in FIG. 10. This modification is different from the second embodiment in the following points:

(1) that the ALC circuit 52 is eliminated;

(2) that the repetition regenerator 53 directly subjects the soft decision data of 32 bits which is output from the CDMA receiver 51 to a repetition regeneration processing, and output the data in the form of a soft decision data of 33 bits;

(3) that the DSP 62 outputs the average value Va of the soft decision data of 33 bits which is output from the repetition regenerator 53;

(4) that the soft decision data cut-off position decision unit 64 decides the position at which a part of soft decision data (4 soft decision bits) is cut off on the basis of the average value Va and the result of comparison between the average value Va and the preset threshold value $V_{TH}$; and (5) that the bit selector 65 cuts off the soft decision data of 5 bits (the sign bit+4 soft decision bits) from the soft decision data of 33 bits which is output from the repetition regenerator 53 at the decided cut-off position and outputs them.

The soft decision data cut-off position decision unit 64 decides the position at which a part of the soft decision data is cut off in such a manner (1) that the most significant upper bit at which the binary average value Va is "1" is situated at the third bit of 4 soft decision bits, if $Va \leq V_{TH}$, and (2) that the most significant upper first bit at which the binary average value Vavr is "1" is situated at the second bit of 4 soft decision bits, if Va>$V_{TH}$.

According to this modification, it is possible to suppress the characteristic deterioration to a small extent and, in addition, to simplify the circuit structure by varying the position at which a part of the soft decision data is cut off on the basis of the average value of the soft decision data.

As described above, according to the present invention, since the position at which a part of the soft decision data (e.g., 4 soft decision bits) is cut off is switched on the basis of the repetition rate, it is possible to suppress the characteristic deterioration originated in the repetition rate.

According to the present invention, since the number of bits of the soft decision data which is output from the repetition regenerator is reduced to such an extent as to be within the processing limit of the soft decision error-correction decoder, on the basis of the repetition rate, it is possible to prevent an increase in the circuit scale of the soft decision error-correction decoder.

In addition, according to the present invention, since the position at which a part of soft decision data (4 soft decision bits) is cut off is determined on the basis of the average value of the soft decision data which is output from the CDMA receiver and the result of comparison between the repetition rate and the threshold value, and the part of the soft decision data is cut off at the decided position so as to reduce the number of bits, it is possible to reduce the total circuit scale.

According to the present invention, since the position at which a part of soft decision data (e.g., 4 soft decision bits) is cut off is determined on the basis of the average value of the soft decision data, it is possible to suppress the characteristic deterioration originated in the repetition rate.

Furthermore, according to the present invention, since the number of bits of the soft decision data which is output from the repetition regenerator is reduced to such an extent as to be within the processing limit of the soft decision error-correction decoder, on the basis of the average value of the soft decision data, it is possible to prevent an increase in the circuit scale of the soft decision error-correction decoder.

Moreover, according to the present invention, since the position at which a part of soft decision data (4 soft decision bits) is cut off is determined on the basis of the average value of the soft decision data output from the CDMA receiver and the result of comparison between the average value and the threshold value, and the part of the soft decision data is cut off at the decided position so as to reduce the number of bits, it is possible to reduce the total circuit scale.

As many apparently widely different embodiments of the present invention can be made without departing from the spirit and scope thereof, it is to be understood that the invention is not limited to the specific embodiments thereof except as defined in the depended claims.

What is claimed is:

1. An error correcting apparatus for receiving a signal subjected to a repetition processing in which a part of bits of an error-correction code train are repeatedly transmitted, and decoding said received signal so as to be restored to the original data train, said error-correction apparatus comprising:
   a receiver/demodulator unit for receiving and demodulating a signal subjected to the repetition processing in which a part of bits of the error-correction code train are repeatedly transmitted, and outputting a soft decision data train;
   a soft decision data train generator for adding a soft decision data which corresponds to the repeatedly transmitted bits, so as to generate a soft decision data train which corresponds to the original error-correction code train; and
   a soft decision error-correction decoder for restoring said soft decision data train to said original data train;
   wherein said soft decision data train generator includes:
      a repetition regenerator for obtaining the positions of said bits which are repeatedly transmitted due to said repetition processing, and adding a soft decision data which corresponds to said positions so as to generate said soft decision data train which corresponds to said original error-correction code train;
      a repetition rate calculator for calculating the repetition rate of said received signal subjected to said repetition processing;
      a first soft decision data cut-off position decision unit for deciding a position at which a part of said soft decision data which is to be input into said soft decision error-correction decoder is cut off from said soft decision data which is generated by said repetition regenerator, on the basis of said repetition rate; and
      a first soft decision data cutting means for cutting off said part of said soft decision data at the decided cut-off position and inputting the cut part into said soft decision error-correction decoder.

2. An error-correcting apparatus according to claim 1, wherein said repetition rate calculator calculates said repetition rate on the basis of the number N of bits of the data before said repetition processing and the number ΔN of bits which are repeated due to said repetition processing, the numbers N and ΔN being notified of from a communication party.

3. An error correcting apparatus according to claim 1, wherein said repetition regenerator obtains said positions of said bits which are repeatedly transmitted by executing a repetition algorithm on the basis of the number N of bits of the data before said repetition processing and the number ΔN of bits which are repeated due to said repetition processing, the numbers N and ΔN being notified of from a communication party.

4. An error correcting apparatus according to claim 1, further comprising:
   an average value calculator for calculating the average value of said soft decision data which is demodulated by said demodulator unit;
   a second soft decision data cut-off position decision unit for deciding a position at which a part of said soft decision data which is to be input into said repetition regenerator is cut off from the demodulated soft decision data, on the basis of said average value;
   a second soft decision data cutting means for cutting off a part of said soft decision data of a predetermined number of bits from said demodulated soft decision data on the basis of the decided cut-off position and inputting the cut part into said repetition regenerator; and
   a comparator for comparing said repetition rate with a preset value;
   wherein said first soft decision data cutting means cuts off a plural upper bits from said soft decision data which is generated by said repetition regenerator and inputs said bits into said soft decision error-correction decoder when said repetition rate is larger than said preset value, while cutting off plural lower bits and inputting said bits into said soft decision error-correction decoder when said repetition rate is smaller than said preset value.

5. An error correcting apparatus according to claim 1, further comprising:
- an average value calculator for calculating the average value of said soft decision data which is demodulated by said demodulator unit; and
- a comparator for comparing said repetition rate with a preset value;
- wherein said first soft decision data cut-off position decision unit decides a position at which a part of the soft decision data which is to be input into said soft decision error-correction decoder is cut off from said soft decision data which is generated by said repetition regenerator, on the basis of said average value and the result of comparison between said repetition rate and said preset value.

6. An error correcting apparatus for receiving a signal subjected to a repetition processing in which a part of bits of an error-correction code train are repeatedly transmitted, and decoding said received signal so as to be restored to the original data train before error-correction coding, said error-correction apparatus comprising:
- a receiver/demodulator unit for receiving and demodulating a signal subjected to the repetition processing in which a part of bits of said error-correction code train are repeatedly transmitted, and outputting a soft decision data train;
- a soft decision data train generator for adding a soft decision data which corresponds to the repeatedly transmitted bits, so as to generate a soft decision data train which corresponds to the original error-correction code train; and
- a soft decision error-correction decoder for restoring said soft decision data train to said original data train;
- wherein said soft decision data train generator includes:
  - a repetition regenerator for obtaining the positions of said bits which are repeatedly transmitted due to said repetition processing, and adding said soft decision data which corresponds to said positions so as to generate said soft decision data train which corresponds to said original error-correction code train;
  - an average value calculator for calculating the first average value of said soft decision data which is output from said repetition regenerator;
  - a first soft decision data cut-off position decision unit for deciding a position at which a part of said soft decision data which is to be input into said soft decision error-correction decoder is cut off from said soft decision data which is generated by said repetition regenerator, on the basis of said first average value; and
  - a first soft decision data cutting means for cutting off said part of said soft decision data at the decided cut-off position and inputting the cut part into said soft decision error-correction decoder.

7. An error correcting apparatus according to claim 6, further comprising:
- an average value calculator for calculating the second average value of said soft decision data which is demodulated by said demodulator unit;
- a second soft decision data cut-off position decision unit for deciding a position at which a part of said soft decision data which is to be input into said repetition regenerator is cut off from the demodulated soft decision data, on the basis of said second average value;
- a second soft decision data cutting means for cutting off a part of said soft decision data of a predetermined number of bits from said demodulated soft decision data on the basis of the decided cut-off position and inputting the cut part into said repetition regenerator; and
- a comparator for comparing said first average value of said soft decision data which is output from said repetition regenerator with a preset value;
- wherein said first soft decision data cutting means cuts off plural upper bits from said soft decision data which is generated by said repetition regenerator and inputs said bits into said soft decision error-correction decoder when said first average value is larger than said preset value, while cutting off plural lower bits and inputting said bits into said soft decision error-correction decoder when said first average value is smaller than said preset value.

8. An error correcting apparatus according to claim 6, further comprising:
- an average value calculator for calculating the second average value of said soft decision data which is demodulated by said demodulator unit; and
- a comparator for comparing said first average value of said soft decision data which is output from said repetition regenerator with a preset value;
- wherein said first soft decision data cut-off position decision unit decides a position at which a part of the soft decision data which is to be input into said soft decision error-correction decoder is cut off from said soft decision data which is generated by said repetition regenerator, on the basis of the result of comparison between said first average value and said preset value, and said second average value.

* * * * *